US012550512B2

(12) United States Patent
Lee et al.

(10) Patent No.: US 12,550,512 B2
(45) Date of Patent: Feb. 10, 2026

(54) DISPLAY DEVICE WITH CONNECTING FILM ELECTRICALLY CONNECTING PAD PART WITH FLEXIBLE FILM, AND TILED DISPLAY DEVICE INCLUDING THE SAME

(71) Applicant: Samsung Display Co., LTD., Yongin-si (KR)

(72) Inventors: Seung Kyu Lee, Cheonan-si (KR); Chang Hyeok Choi, Asan-si (KR); Yong Sik Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 450 days.

(21) Appl. No.: 17/546,474

(22) Filed: Dec. 9, 2021

(65) Prior Publication Data
US 2022/0293670 A1   Sep. 15, 2022

(30) Foreign Application Priority Data
Mar. 10, 2021   (KR) .......................... 10-2021-0031368

(51) Int. Cl.
| | |
|---|---|
| *H10H 29/14* | (2025.01) |
| *G09F 9/302* | (2006.01) |
| *G09F 9/33* | (2006.01) |
| *H10H 20/01* | (2025.01) |
| *H10H 20/857* | (2025.01) |

(52) U.S. Cl.
CPC .......... *H10H 29/142* (2025.01); *G09F 9/3026* (2013.01); *G09F 9/33* (2013.01); *H10H 20/01* (2025.01); *H10H 20/857* (2025.01); *H10H 20/0364* (2025.01)

(58) Field of Classification Search
CPC ..... H01L 33/005; H01L 33/62; H01L 27/124; H10K 59/131; H10K 59/18
USPC .......................................................... 257/79
See application file for complete search history.

(56) References Cited

U.S. PATENT DOCUMENTS

| | | | |
|---|---|---|---|
| 8,847,229 B2 | 9/2014 | Suzuki et al. | |
| 2011/0291153 A1* | 12/2011 | Yang ........................ | H01L 24/73 257/E33.056 |
| 2013/0161628 A1* | 6/2013 | Suzuki ................... | H01L 23/544 438/34 |
| 2015/0370113 A1* | 12/2015 | Kim ..................... | G02F 1/13336 361/679.21 |
| 2016/0329386 A1* | 11/2016 | Sauers ................... | H10K 71/00 |

(Continued)

FOREIGN PATENT DOCUMENTS

| | | |
|---|---|---|
| CN | 110752223 | 2/2020 |
| JP | 2016-91001 | 5/2016 |

(Continued)

*Primary Examiner* — Norman D Richards
*Assistant Examiner* — Laura M Dykes
(74) *Attorney, Agent, or Firm* — Womble Bond Dickinson (US) LLP

(57) ABSTRACT

A display device includes a first substrate including a first contact hole, a pad part disposed on the first substrate, the pad part overlapping the first contact hole, a second substrate disposed on the pad part and the first substrate, a display layer disposed on the second substrate, a flexible film disposed on a bottom surface of the first substrate, and a connecting film inserted in the first contact hole, the connecting film electrically connecting the pad part and the flexible film. An upper width of the first contact hole is greater than a lower width of the first contact hole.

10 Claims, 18 Drawing Sheets

(56) References Cited

U.S. PATENT DOCUMENTS

| | | | |
|---|---|---|---|
| 2018/0012549 A1* | 1/2018 | Lee | G09G 3/3266 |
| 2019/0011754 A1* | 1/2019 | Chen | G02F 1/1368 |
| 2019/0131377 A1* | 5/2019 | Kwon | H10K 50/844 |
| 2019/0289717 A1* | 9/2019 | Yueh | H05K 1/115 |
| 2020/0203462 A1* | 6/2020 | Oh | H10K 59/40 |
| 2020/0236792 A1* | 7/2020 | Dong | H01L 23/4985 |
| 2020/0359499 A1* | 11/2020 | Hwu | H10K 59/131 |
| 2021/0296543 A1* | 9/2021 | Aoyama | H01L 27/156 |

FOREIGN PATENT DOCUMENTS

| | | |
|---|---|---|
| KR | 10-2022-0049082 | 4/2022 |
| WO | 2012/127780 | 9/2012 |

\* cited by examiner

DISPLAY DEVICE WITH CONNECTING FILM ELECTRICALLY CONNECTING PAD PART WITH FLEXIBLE FILM, AND TILED DISPLAY DEVICE INCLUDING THE SAME

CROSS-REFERENCE TO RELATED APPLICATION(S)

This application claims priority to and the benefit of Korean Patent Application No. 10-2021-0031368 under 35 U.S.C. § 119, filed in the Korean Intellectual Property Office (KIPO) on Mar. 10, 2021, the contents of which are incorporated herein by reference.

BACKGROUND

1. Technical Field

The disclosure relates to a display device, a method of manufacturing the display device, and a tiled display device including the display device.

2. Description of the Related Art

As the information society has developed, the demand for display devices for displaying images has diversified. For example, display devices have been applied to various electronic devices such as smart phones, digital cameras, notebook computers, navigation systems, and smart televisions. Examples of display devices include flat panel display devices such as a liquid crystal display (LCD) device, a field emission display (FED) device, or an organic light-emitting diode (OLED) display device. A light-emitting display device, which is a type of flat panel display device, includes light-emitting elements capable of emitting light and can thus display an image without a requirement of a backlight unit for providing light to a display panel.

When a large-size display device is fabricated, the defect rate of light-emitting elements may increase due to an increase in the number of pixels, and the productivity or reliability of the display device may decrease. To address these problems, a tiled display device with a large screen may be implemented by connecting multiple display devices having a relatively small size. The tiled display device may include seams (or boundary portions) between the multiple display devices due to the presence of the non-display areas or bezels of the multiple display devices. However, when an image is being displayed on the entire screen of the tiled display device, the seams cause a sense of discontinuity, adversely affecting the sense of immersion of the image.

SUMMARY

Embodiments of the disclosure provide a display device, a method of manufacturing the display device, and a tiled display device including the display device, which are capable of improving productivity and reliability by preventing damage to a substrate and the accidental detachment of a pad part on the substrate during the formation of contact holes, to reduce the level of difficulty of manufacture.

Embodiments of the disclosure also provide a tiled display device capable of eliminating the sense of discontinuity between multiple display devices and enhancing the sense of immersion of an image by preventing boundary portions or non-display areas between the multiple display devices from becoming visible.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to an embodiment of the disclosure, a display device may comprise a first substrate including a first contact hole, a pad part disposed on the first substrate, the pad part overlapping the first contact hole, a second substrate disposed on the pad part and the first substrate, a display layer disposed on the second substrate, a flexible film disposed on a bottom surface of the first substrate, and a connecting film inserted in the first contact hole, the connecting film electrically connecting the pad part and the flexible film. An upper width of the first contact hole is greater than a lower width of the first contact hole.

A top surface of the connecting film and a top surface of the first substrate may be disposed on a same plane.

A bottom surface of the pad part may be flat.

The display device may further comprise a filler part disposed along an upper periphery of the first contact hole, the filler part surrounding an upper part of the connecting film.

The filler part may include at least one of an acrylic resin, an epoxy resin, a phenolic resin, a polyamide resin, and a polyimide resin.

The filler part may include a positive photoresist or a negative photoresist.

The display device may further comprise an adhesive member attaching the flexible film to the bottom surface of the first substrate.

The display device may further comprise a first connecting line disposed on the second substrate, the first connecting line being electrically connected to the pad part through a second contact hole formed in the second substrate.

The display layer may comprise a thin-film transistor layer disposed on the second substrate and including thin-film transistors, a light-emitting element layer disposed on the thin-film transistor layer and including light-emitting elements, and a wavelength conversion layer disposed on the light-emitting element layer and converting the wavelength of light emitted by the light-emitting elements.

The thin-film transistor layer may comprise a buffer layer disposed on the first connecting line and the second substrate, a gate insulating film disposed on the buffer layer, an interlayer insulating film disposed on the gate insulating film, connecting electrodes disposed on the interlayer insulating film and electrically connected to the thin-film transistors, and a second connecting line disposed on the interlayer insulating film and electrically connected to the first connecting line through a third contact hole penetrating the interlayer insulating film, the gate insulating film, and the buffer layer.

According to an embodiment of the disclosure, a method of manufacturing a display device comprises providing a carrier substrate and a first substrate disposed on the carrier substrate, forming a first contact hole by patterning a top surface of the first substrate, filling the first contact hole with a filler part, placing a pad part disposed on the filler part, forming a second substrate overlapping the pad part and the first substrate, forming a display layer disposed on the second substrate, removing the carrier substrate from a bottom surface of the first substrate, etching the filler part, from the bottom surface of the first substrate, with an etch selectivity of the filler part with respect to the first substrate, and electrically connecting a flexible film disposed on the bottom surface of the first substrate, to the pad part by inserting a connecting film in the first contact hole.

The etch selectivity may be set such that an etch rate of the filler part is greater than an etch rate of the first substrate.

The etch selectivity may be determined by at least one process condition selected from among gas, temperature, pressure, and plasma power.

The etching of the filler part may comprise etching the filler part such that a part of the filler part remains along an upper periphery of the first contact hole.

The filling of the first contact hole with the filler part may comprise filling the first contact hole with the filler part such that a top surface of the filler part and the top surface of the first substrate are disposed on a same plane.

The etching of the filler part may comprise etching a part of a bottom surface of the first substrate with the etch selectivity.

The etching of the filler part may comprise performing at least one of a dry etching process, a plasma etching process, and a laser etching process.

The filler part may include at least one of an acrylic resin, an epoxy resin, a phenolic resin, a polyamide resin, and a polyimide resin.

The filler part may include a positive photoresist or a negative photoresist.

According to an embodiment of the disclosure, a tiled display device may comprise display devices each including a display area including pixels, and a non-display area adjacent to the display area, and a bonding member connecting the display devices to one another. Each of the display devices may comprise a first substrate including a first contact hole, a pad part disposed on the first substrate and overlapping the first contact hole, a second substrate disposed on the pad part and the first substrate, a display layer disposed on the second substrate, a flexible film disposed on a bottom surface of the first substrate, and a connecting film inserted in the first contact hole and electrically connecting the pad part and the flexible film. An upper width of the first contact hole is greater than a lower width of the first contact hole.

According to the aforementioned and other embodiments of the disclosure, as a contact hole is formed by patterning a substrate from the top surface of the substrate and a filler part is removed using the etch selectivity of the filler part with respect to the substrate, after the deposition of a display layer with the use of the filler part, damage to the substrate can be prevented, and a pad part can be prevented from being accidently detached from the substrate.

In addition, as a pad part on one surface of the substrate and a flexible film on the other surface of the substrate are electrically connected by a connecting film inserted in the contact hole of the substrate, the size of the non-display area of a display device can be minimized. Accordingly, the distance between multiple display devices included in a tiled display device can be minimized, and as a result, the non-display area or the seam between the multiple display devices can be prevented from becoming recognizable to a user.

Other features and embodiments may be apparent from the following detailed description, the drawings, and the claims.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION OF THE EMBODIMENTS

Figure 1:
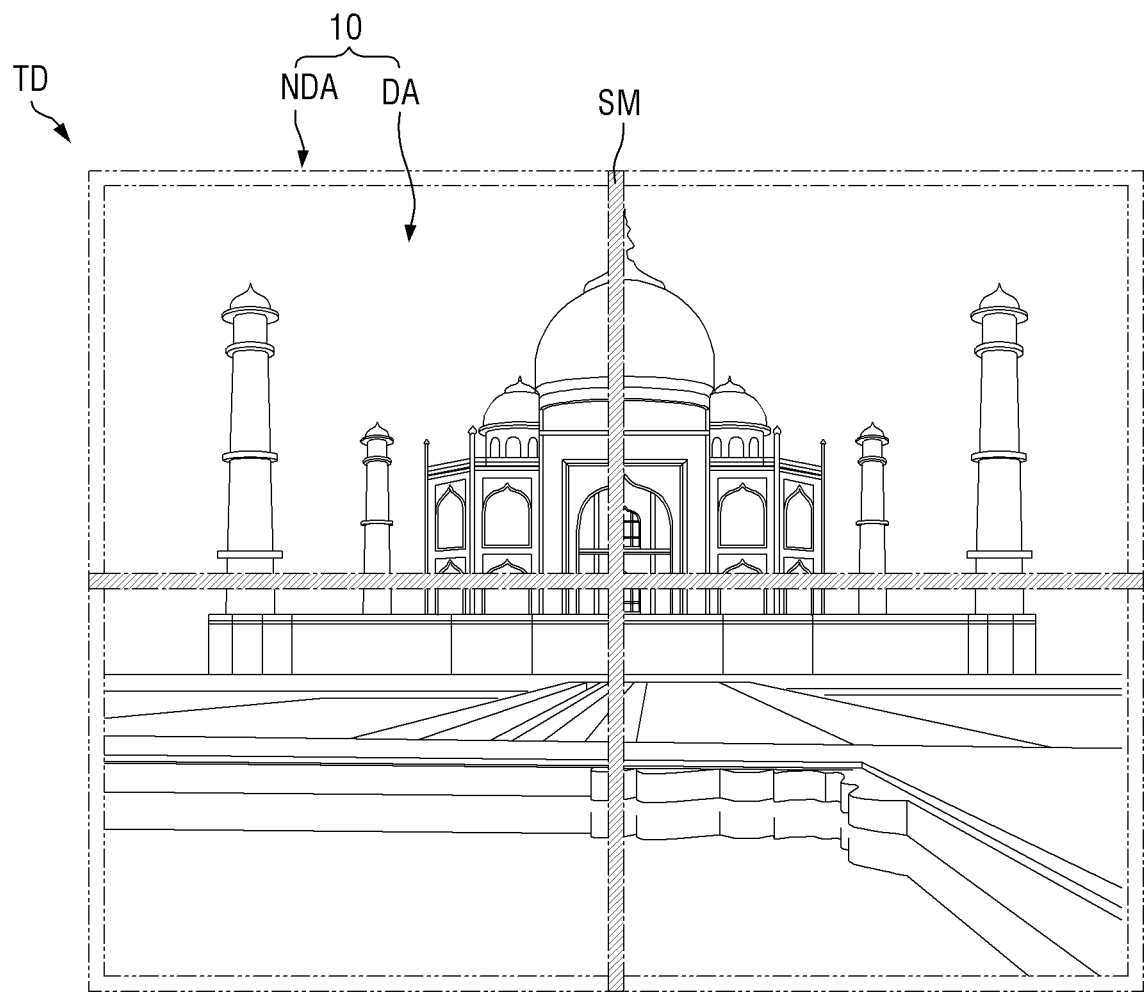
FIG. 1 is a schematic plan view of a tiled display device according to an embodiment of the disclosure.
Figure 1:
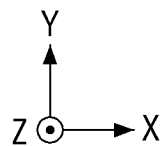

In the following description, for the purposes of explanation, numerous details are set forth in order to provide a thorough understanding of various embodiments or implementations of the disclosure. As used herein "embodiments" and "implementations" are interchangeable words that are non-limiting examples of devices or methods employing one or more of the implementations or embodiments disclosed herein. It is apparent, however, that various embodiments may be practiced without these details or with one or more equivalent arrangements. In other instances, structures and devices may be shown in block diagram form in order to avoid unnecessarily obscuring various embodiments. Further, various embodiments may be different, but do not have to be exclusive. For example, shapes, configurations, and characteristics of an embodiment may be used or implemented in another embodiment without departing from the scope of the disclosure.

Unless otherwise specified, the illustrated embodiments are to be understood as providing features of varying detail of some or a number of ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be substantially perpendicular to one another, or may represent different directions that may not be perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

The terms "and" and "or" may be used in the conjunctive or disjunctive sense and may be understood to be equivalent to "and/or."

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (for example, as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (for example, rotated 90 degrees or about 90 degrees or at other orientations), and, as such, the spatially relative descriptors used herein interpreted accordingly.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or "to not overlap" another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terminology used herein is for the purpose of describing embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," "has," and/or "having," and/or variations thereof when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

For example, "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection or coupling.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as being limited to the illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Some or a number of embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (for example, microcode) to perform various functions discussed herein and may optionally be driven by firmware and/or software. It is also contemplated that each block, unit, and/or module may be implemented by dedicated hardware, or as a combination of dedicated hardware to perform some or a number of functions and a processor (for example, one or more programmed microprocessors and associated circuitry) to perform other functions. Also, each block, unit, and/or module of some or a number of embodiments may be physically separated into two or more interacting and discrete blocks, units, and/or modules without departing from the scope of the disclosure. Further, the blocks, units, and/or modules of some or a number of embodiments may be physically combined into more complex blocks, units, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an idealized or excessively formal sense, unless clearly so defined herein.

FIG. 1 is a schematic plan view of a tiled display device according to an embodiment.

Referring to FIG. 1, a tiled display device TD may include display devices 10. The display devices 10 may be arranged in a lattice pattern, but the disclosure is not limited thereto. The display devices 10 may be extended to each other in a first direction (or an X-axis direction) or a second direction (or a Y-axis direction), and the tiled display device TD may have a particular shape. For example, the display devices 10 may all have the same size, but the disclosure is not limited thereto. As another example, the display devices 10 may have different sizes.

The display devices 10 may have a rectangular shape with a pair of long sides and a pair of short sides. The display devices 10 may be arranged by connecting the long sides or the short sides of each of the display devices 10. Some (or a part) of the display devices 10 may be arranged along the edges of the tiled display device TD to form the sides of the tiled display device TD. Some of the display devices 10 may be arranged at the corners of the tiled display device TD to form each pair of adjacent sides of the tiled display device TD. Some of the display devices 10 may be disposed in the middle of the tiled display device TD and may be surrounded by other display devices 10.

Each of the display devices 10 may include a display area DA and a non-display area NDA. The display area DA may include pixels and may display an image. Each of the pixels may include organic light-emitting diodes (OLEDs) including organic light-emitting layers, micro-light-emitting diodes (micro LEDs), quantum-dot light-emitting diodes (QLEDs) including quantum-dot light-emitting layers, or inorganic light-emitting elements including an inorganic semiconductor. Each of the pixels will hereinafter be described as including inorganic light-emitting elements, but the disclosure is not limited thereto. The non-display area NDA may be disposed around the display area DA to surround the display area DA and may not display an image.

The tiled display device TD may generally have a flat shape, but the disclosure is not limited thereto. The tiled display device TD may have a stereoscopic shape and may thus provide a sense of depth to a user. For example, in case that the tiled display device TD has a stereoscopic shape, at least some of the display devices 10 may have a curved shape. In an embodiment, the display devices 10 may all have a flat shape and may be connected to one another at a predetermined angle so that the tiled display device TD may have a stereoscopic shape.

The tiled display device TD may include a bonding area SM which is disposed between display areas DA. The tiled display device TD may be obtained by connecting the non-display areas NDA of the display devices 10. The display devices 10 may be connected to one another via a bonding member or an adhesive member disposed in the bonding area SM. The bonding area SM may not include pad units (or pad parts) or flexible films attached to pad parts. Thus, the distance between the display areas DA of the display devices 10 may be so close that the bonding area SM may become substantially invisible to the user. The display areas DA of the display devices 10 and the bonding area SM may have substantially the same reflectance. Thus, the tiled display device TD can overcome a sense of discontinuity between the display devices 10 and improve the degree of immersion in an image by preventing the bonding area SM from being visually recognized by the user.

Figure 2:
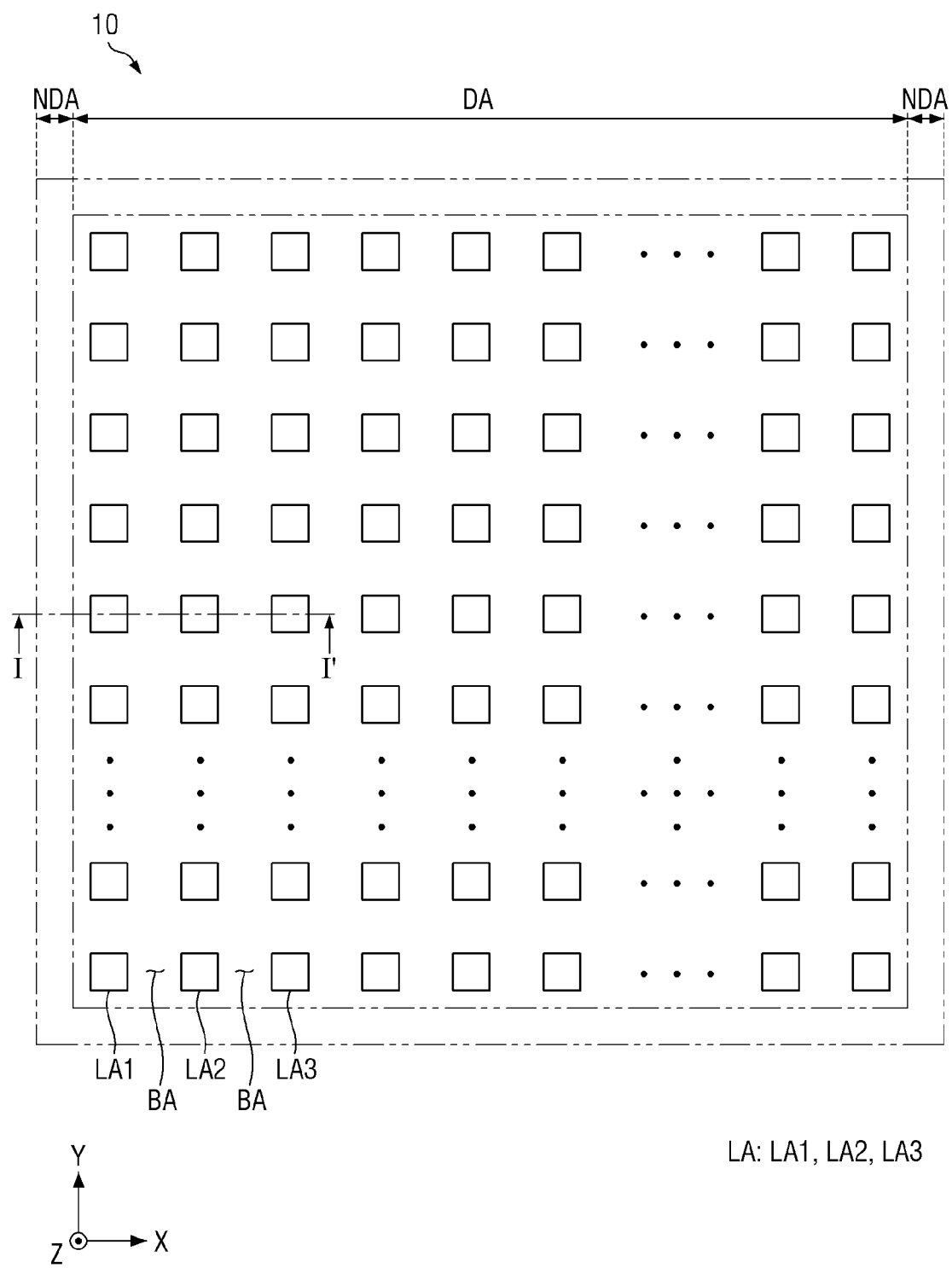
FIG. 2 is a schematic plan view of a display device according to an embodiment of the disclosure.

FIG. 2 is a schematic plan view of a display device according to an embodiment.

Referring to FIG. 2, a display device 10 may include pixels which are arranged in multiple rows and multiple columns, in a display area DA. Each of the pixels may include an emission area LA which is defined by a pixel-defining film or a bank, and may emit light having a predetermined peak wavelength through the emission area LA. For example, the display area DA of the display device 10 may include first emission areas LA1, second emission areas LA2, and third emission areas LA3. The first emission areas LA1, the second emission areas LA2, and the third emission areas LA3 may be areas that emit light generated by light-emitting elements of the display device 10 to the outside of the display device 10.

The first emission areas LA1, the second emission areas LA2, and the third emission areas LA3 may emit light having a predetermined peak wavelength to the outside of the display device 10. The first emission areas LA1, the second emission areas LA2, and the third emission areas LA3 may emit first-color light, second-color light, and third-color light, respectively. For example, the first-color light may be red light having a peak wavelength of about 610 nm to about 650 nm, the second-color light may be green light having a peak wavelength of about 510 nm to about 550 nm, and the third-color light may be blue light having a peak wavelength of about 440 nm to about 480 nm. However, the disclosure is not limited to this example.

The first emission areas LA1, the second emission areas LA2, and the third emission areas LA3 may be sequentially and repeatedly arranged in the first direction (or the X-axis direction) in each of the display areas DA. For example, the first emission areas LA1 may be larger in size than the second emission areas LA2, and the second emission areas LA2 may be larger in size than the third emission area LA3. In an embodiment, the first emission areas LA1, the second emission areas LA2, and the third emission areas LA3 may have substantially the same size.

The display device DA of the display device 10 may further include a light-blocking area BA which surrounds the first emission areas LA1, the second emission areas LA2, and the third emission areas LA3. The light-blocking area BA may prevent beams of light emitted from the first emission areas LA1, the second emission areas LA2, and the third emission areas LA3 from being mixed together.

Figure 3:
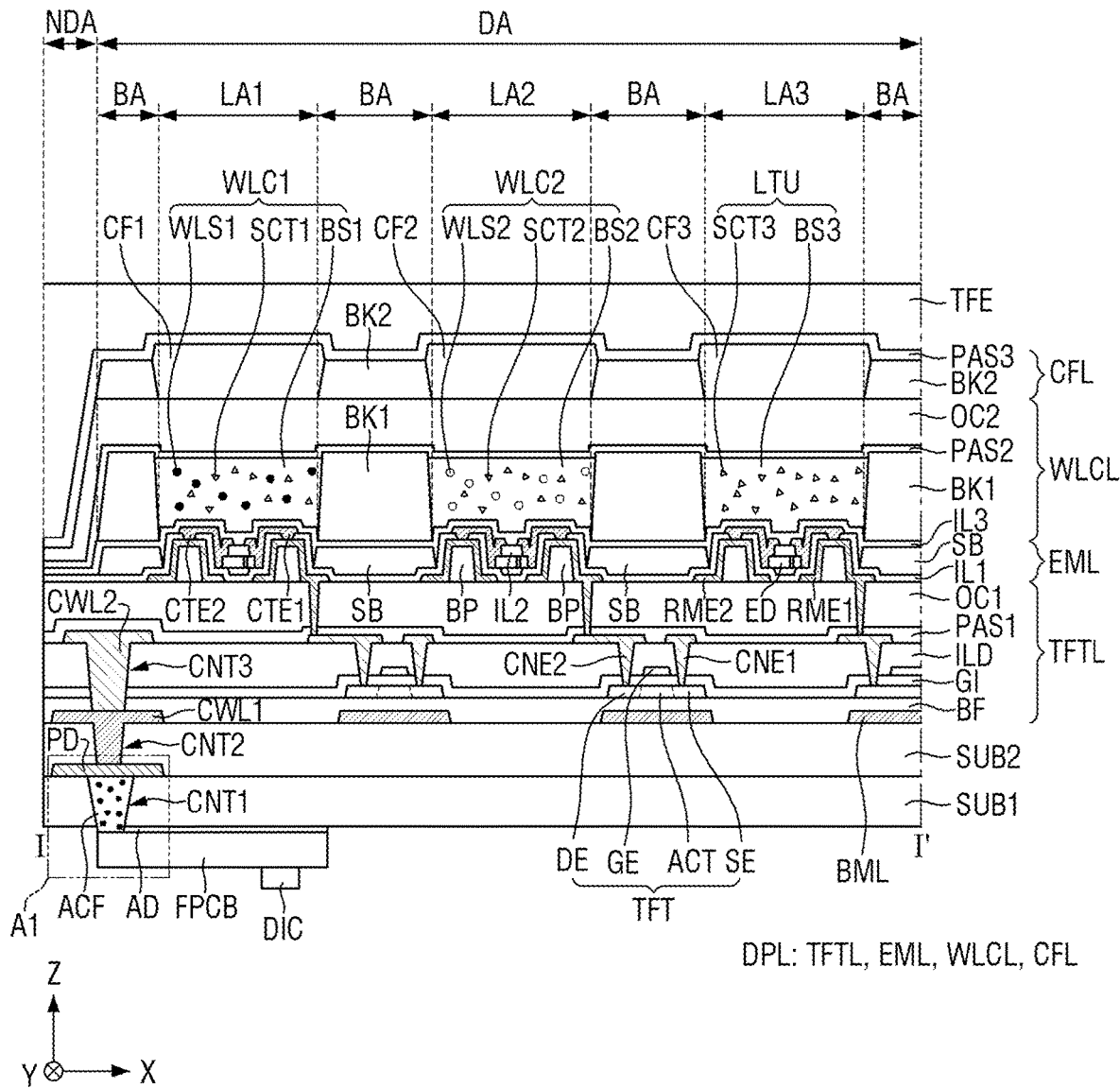
FIG. 3 is a schematic cross-sectional view taken along line I-I' of FIG. 2.
Figure 4:
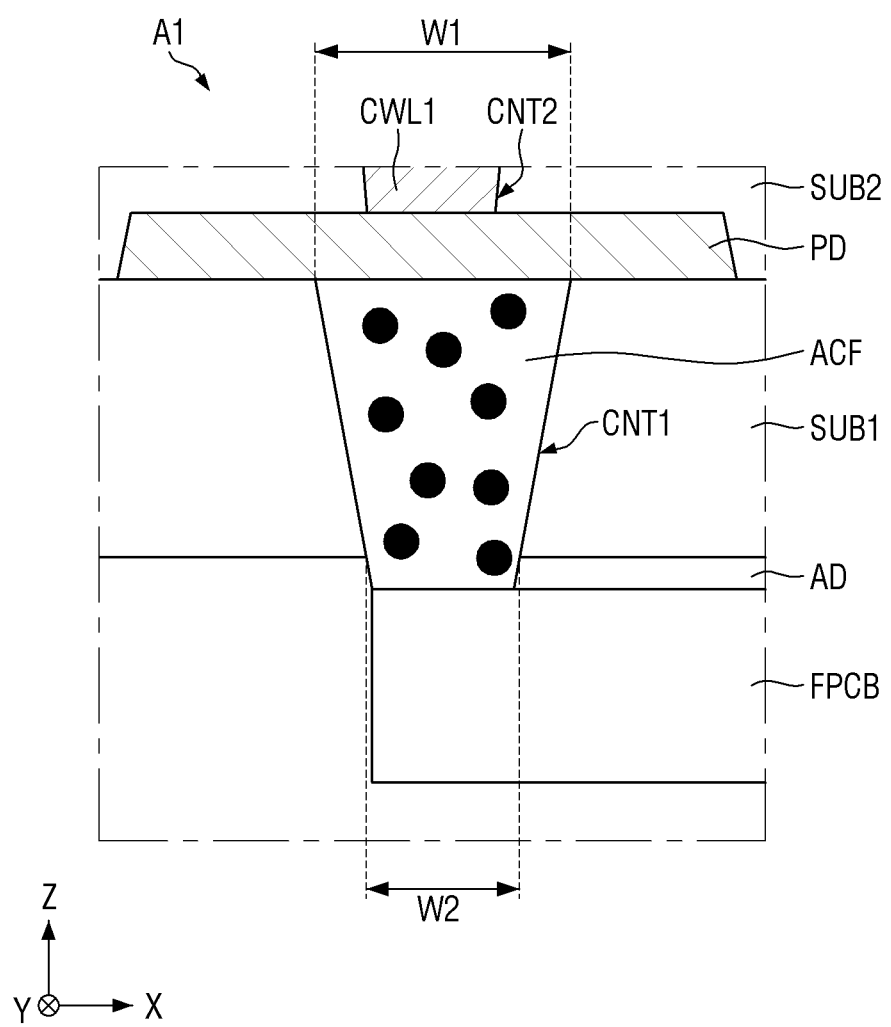
FIG. 4 is a schematic enlarged cross-sectional view of area A1 of FIG. 3.
Figure 5:
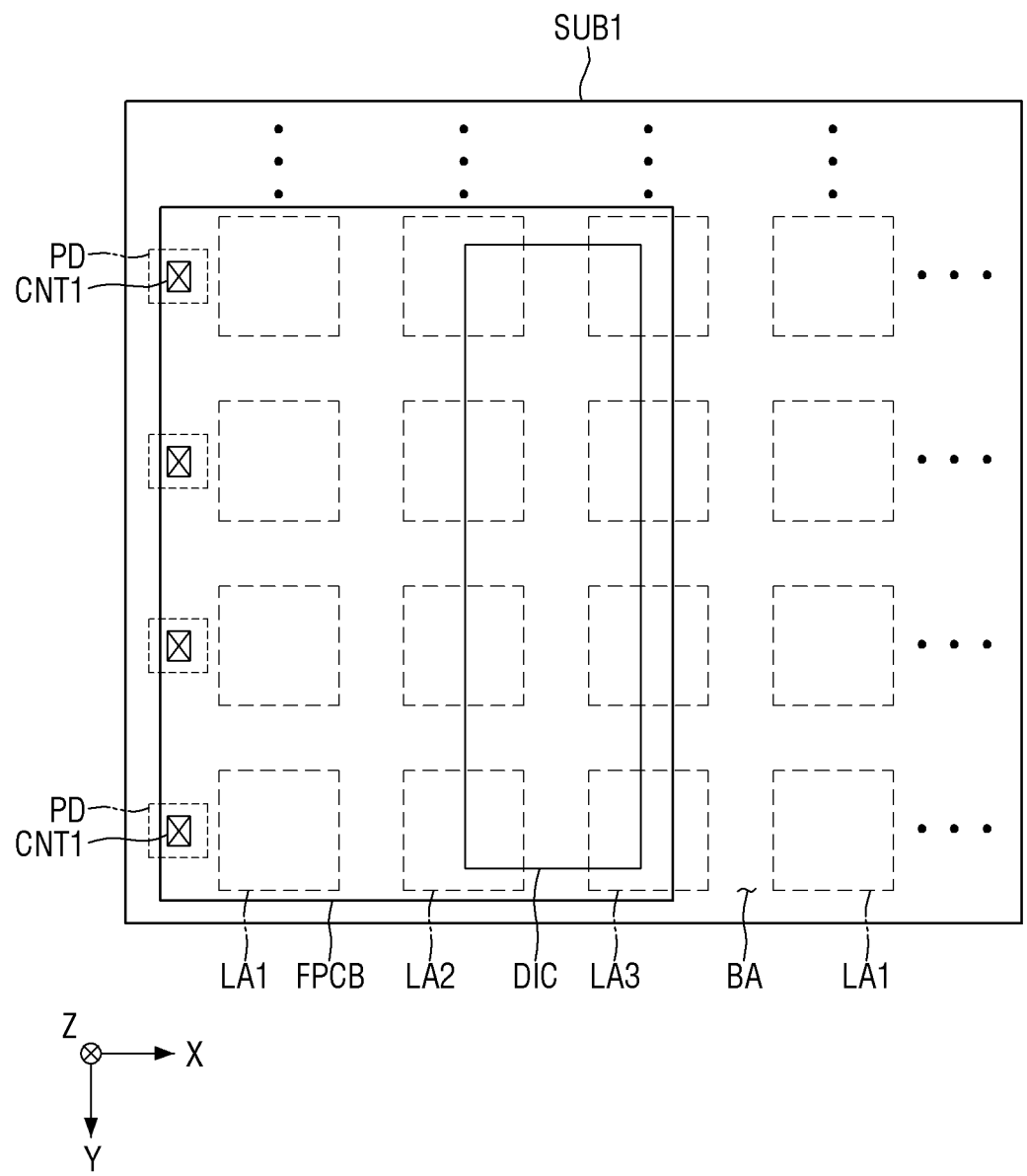
FIG. 5 is a schematic bottom view of the display device of FIG. 2.

FIG. 3 is a schematic cross-sectional view taken along line I-I' of FIG. 2, FIG. 4 is a schematic enlarged cross-sectional view of area A1 of FIG. 3, and FIG. 5 is a schematic bottom view of the display device of FIG. 2.

Referring to FIGS. 3 to 5, the display area DA of the display device 10 may include first, second, and third emission areas LA1, LA2, and LA3. The first, second, and third emission areas LA1, LA2, and LA3 may be areas that output light generated by light-emitting elements ED of the display device 10 to the outside of the display device 10.

The display device 10 may include a first substrate SUB1, a second substrate SUB2, a display layer DPL, an encapsulation layer TFE, a pad part PD, a connecting film ACF, a flexible film FPCB, and a data driver DIC.

The first substrate SUB1 may support the display device 10. The first substrate SUB1 may be a base substrate or a base member. The first substrate SUB1 may be a flexible substrate that is bendable, foldable, or rollable. For example, the first substrate SUB1 may include an insulating material such as a polymer resin, for example, polyimide (PI), but the disclosure is not limited thereto.

The first substrate SUB1 may include a first contact hole CNT1. The first contact hole CNT1 may be formed by patterning the first substrate SUB1 from the top surface of the first substrate SUB1 and may penetrate through the first substrate SUB1 to the bottom surface of the first substrate SUB1. For example, an upper width W1 of the first contact hole CNT1 may be greater than a lower width W2 of the first contact hole CNT1.

The second substrate SUB2 may be disposed on the first substrate SUB1. The second substrate SUB2 may be a base substrate or a base member. The second substrate SUB2 may be a flexible substrate that is bendable, foldable, or rollable. For example, the second substrate SUB2 may include an insulating material such as a polymer resin, for example, PI, but the disclosure is not limited thereto.

The second substrate SUB2 may include a second contact hole CNT2. The second contact hole CNT2 may be formed by patterning the second substrate SUB2 from the top surface of the second substrate SUB2 and may penetrate through the second substrate SUB2 to the bottom surface of the second substrate SUB2. For example, the upper width of the second contact hole CNT2 may be greater than the lower width of the second contact hole CNT2. The second contact hole CNT2 may overlap the first contact hole CNT1 in a thickness direction (or a Z-axis direction), but the disclosure is not limited thereto.

The display layer DPL may be disposed on the second substrate SUB2. The display layer DPL may include a thin-film transistor layer TFTL, a light-emitting element layer EML, a wavelength conversion layer WLCL, and a color filter layer CFL. The thin-film transistor layer TFTL may include a light-blocking layer BML, a first connecting line CWL1, a buffer layer BF, thin-film transistors TFT, a gate insulating film GI, an interlayer insulating film ILD, first connecting electrodes CNE1, second connecting electrodes CNE2, a second connecting line CWL2, a first passivation layer PAS1, and a first planarization layer OC1.

The light-blocking layer BML may be disposed on the second substrate SUB2. The light-blocking layer BML may overlap the thin-film transistors TFT in the thickness direction (or the Z-axis direction) and may block the transmission of external light incident upon the thin-film transistors TFT. For example, the light-blocking layer BML may be formed as a single layer or a multi-layer including molybdenum (Mo), aluminum (Al), chromium (Cr), gold (Au), titanium (Ti), nickel (Ni), neodymium (Nd), copper (Cu), or an alloy thereof The first connecting line CWL1 may be disposed on the second substrate SUB2 to be spaced apart from the light-blocking layer BML. The first connecting line CWL1 and the light-blocking layer BML may be formed in the same layer and of the same material. The first connecting line CWL1 may be inserted into the second contact hole CNT2 to be electrically connected to the pad part PD. The first connecting line CWL1 may provide an electrical signal received from the pad part PD to the thin-film transistor layer TFTL through the second connecting line CWL2.

The buffer layer BF may cover the light-blocking layer BML, the first connecting line CWL1, and the second substrate SUB2. The buffer layer BF may include a third contact hole CNT3, in which the second connecting line CWL2 is inserted. The buffer layer BF may include an inorganic material capable of preventing the infiltration of the air or moisture. For example, the buffer layer BF may include inorganic films that are alternately stacked.

The thin-film transistors TFT may be disposed on the buffer layer BF and may form the pixel circuits of pixels. For example, the thin-film transistors TFT may be the driving or switching transistors of pixel circuits. The thin-film transistors TFT may include active regions ACT, gate electrodes GE, source electrodes SE, and drain electrodes DE.

The semiconductor regions ACT, the source electrodes SE, and the drain electrodes DE may be disposed on the buffer layer BF. The semiconductor regions ACT may overlap the gate electrodes GE in the thickness direction (or the Z-axis direction) and may be insulated from the gate electrodes GE by the gate insulating film GI. The source electrodes SE and the drain electrodes DE may be obtained by transforming the material of the semiconductor regions ACT into conductors.

The gate electrodes GE may be disposed on the gate insulating film GI. The gate electrodes GE may overlap the semiconductor regions ACT with the gate insulating film GI interposed therebetween.

The gate insulating film GI may be disposed on the semiconductor regions ACT, the source electrodes SE, and the drain electrodes DE. For example, the gate insulating film GI may cover the semiconductor regions ACT, the source electrodes SE, the drain electrodes DE, and the buffer layer BF and may insulate the semiconductor regions ACT and the gate insulating electrodes GE. The gate insulating film GI may include the third contact hole CNT3, in which the second connecting line CWL2 is inserted. The gate insulating film GI may also include contact holes that are penetrated by the first connecting electrodes CNE1 and the second connecting electrodes CNE2.

The interlayer insulating film ILD may be disposed on the gate electrodes GE. The interlayer insulating film ILD may include the third contact hole CNT3, into which the second connecting line CWL2 is inserted. Thus, the third contact hole CNT3 may penetrate the interlayer insulating film ILD, the gate insulating film GI, and the buffer layer BF. The interlayer insulating film ILD may also include contact holes that are penetrated by the first connecting electrodes CNE1 and the second connecting electrodes CNE2.

The first connecting electrodes CNE1 and the second connecting electrodes CNE2 may be disposed on the interlayer insulating film ILD to be spaced apart from one another. The first connecting electrodes CNE1 may electrically connect data lines or power lines to the source electrodes SE of the thin-film transistors TFT. The first connecting electrodes CNE1 may contact the source electrodes SE through contact holes provided in the interlayer insulating film ILD and the gate insulating film GI.

The second connecting electrodes CNE may electrically connect the drain electrodes DE of the thin-film transistors TFT to first electrodes RME1. The second connecting electrodes CNE2 may contact the drain electrodes DE through the contact holes provided in the interlayer insulating film ILD and the gate insulating film GI.

The second connecting line CWL2 may be disposed on the interlayer insulating film ILD to be spaced apart from the first connecting electrodes CNE1 and the second connecting electrodes CNE2. The second connecting line CWL2 and the first and second connecting electrodes CNE1 and CNE2 may be formed in the same layer and of the same material. The second connecting line CWL2 may be inserted in the third contact hole CNT3 to be electrically connected to the first connecting line CWL1, which is disposed on the second substrate SUB2.

For example, the second connecting line CWL2 may be electrically connected to a data line and may thus provide a data voltage to the thin-film transistors TFT. As another example, the second connecting line CWL2 may be electrically connected to a power line and may thus provide a power supply voltage to the thin-film transistors TFT.

As another example, the second connecting line CWL2 may be disposed on the gate insulating film GI, and the third contact hole CNT3 may penetrate the gate insulating film GI and the buffer layer BF. In this case, the second connecting line CWL2 may be electrically connected to a gate line and may thus provide a gate signal to the thin-film transistors TFT.

The first passivation layer PAS1 may cover (or overlap) the first connecting electrodes CNE1, the second connecting electrodes CNE2, the second connecting line CWL2, and the interlayer insulating film ILD. The first passivation layer PAS1 may protect the thin-film transistors TFT. The first passivation layer PAS1 may include contact holes that are penetrated by the first electrodes RME1.

The first planarization layer OC1 may be provided on the first passivation layer PAS1 and may planarize the tops of the thin-film transistors TFT. For example, the first planarization layer OC1 may include contact holes that are penetrated by the first electrodes RME1. Here, the contact holes of the first planarization layer OC1 may be connected to the contact holes of the first passivation layer PAS1. The first planarization layer OC1 may include an organic insulating material such as PI.

The light-emitting element layer EML may be disposed on the thin-film transistor layer TFTL. The light-emitting element layer EML may include protruding patterns BP, the first electrodes RME1, second electrodes RME2, a first insulating film IL1, light-emitting elements ED, a second insulating film IL2, first contact electrodes CTE1, second contact electrodes CTE2, sub-banks SB, and a third insulating film IL3.

The protruding patterns BP may be disposed on the first planarization layer OC1. The protruding patterns BP may protrude at least in part from the top surface of the first planarization layer OC1. The protruding patterns BP may be disposed in emission areas LA or opening areas of the pixels. The light-emitting elements ED may be disposed between the protruding patterns BP. Each of the protruding patterns BP may have inclined side surfaces, and light emitted by the light-emitting elements ED may be reflected by the first or second electrodes RME1 or RME2 on the protruding patterns BP. For example, the protruding patterns BP may include an organic insulating material such as PI.

The first electrodes RME1 may be disposed on the first planarization layer OC1 and the protruding patterns BP. The first electrodes RME1 may be disposed on protruding patterns BP on first sides of the light-emitting elements ED. The first electrodes RME1 may be disposed on inclined side surfaces of the protruding patterns BP to reflect light emitted by the light-emitting elements ED. The first electrodes RME1 may be inserted into the contact holes of the first planarization layer OC1 to be electrically connected to the second connecting electrodes CNE2. The first electrodes RME1 may be electrically connected to first ends of the light-emitting elements ED through the first contact electrodes CTE1. For example, the first electrodes RME1 may receive a voltage that is proportional to the luminance of the light-emitting elements ED, from the pixel circuits of the pixels.

The second electrodes RME2 may be disposed on the first planarization layer OC1 and the protruding patterns BP. The second electrodes RME2 may be disposed on protruding patterns BP on second sides of the light-emitting elements ED. The second electrodes RME2 may be disposed on inclined side surfaces of the protruding patterns BP to reflect light emitted by the light-emitting elements ED. The second electrodes RME2 may be electrically connected to second ends of the light-emitting elements ED through the second contact electrodes CTE2. For example, the second electrodes RME2 may receive a low-potential voltage to be supplied to the pixels from low-potential lines.

The first electrodes RME1 and the second electrodes RME2 may include a conductive material with high reflectance. For example, the first electrodes RME1 and the second electrodes RME2 may include at least one of silver (Ag), Cu, Al, Ni, and lanthanum (La). As another example, the first electrodes RME1 and the second electrodes RME2 may include a material such as indium tin oxide (ITO), indium zinc oxide (IZO), or indium tin zinc oxide (ITZO). As another example, the first electrodes RME1 and the second electrodes RME2 may include either multi-layers having a transparent conductive material layer and a metal layer with high reflectance or single layers including a transparent conductive material or a metal with high reflectance. The first electrodes RME1 and the second electrodes RME2 may have a stack structure such as ITO/Ag/ITO/, ITO/Ag/IZO, or ITO/Ag/ITZO/IZO.

The first insulating film IL1 may be disposed on the first planarization layer OC1, the first electrodes RME1, and the second electrodes RME2. The first insulating film IL1 may protect and insulate the first electrodes RME1 and the second electrodes RME2. The first insulating film IL1 may prevent the light-emitting elements ED from being damaged by directly contacting the first electrodes RME1 and the second electrodes RME2 during the alignment of the light-emitting elements ED.

The sub-banks SB may be disposed in a light-blocking area BA and on the first insulating film IL1. The sub-banks SB may be disposed along the boundaries of each of the pixels to define and separate the pixels. The sub-banks SB may have a predetermined height and may include an organic insulating material such as PI.

The light-emitting elements ED may be disposed on the first insulating film IL1. The light-emitting elements ED may be aligned in parallel between the first electrodes RME1 and the second electrodes RME2. The length of the light-emitting elements ED may be greater than the distance between the first electrodes RME1 and the second electrodes RME2. Each of the light-emitting elements ED may include semiconductor layers, and the first ends and the second ends of the light-emitting elements ED may be defined based on one of the semiconductor layers. The first ends of the light-emitting elements ED may be disposed on the first electrodes RME1, and the second ends of the light-emitting elements ED may be disposed on the second electrodes RME2. The first ends of the light-emitting elements ED may be electrically connected to the first electrodes RME1 through the first contact electrodes CTE1, and the second ends of the light-emitting elements ED may be electrically connected to the second electrodes RME2 through the second contact electrodes CTE2.

The light-emitting elements ED may have a size of micrometers or nanometers and may be inorganic light-emitting diodes (LEDs) including an inorganic material. The inorganic LEDs may be aligned between the first electrodes RME1 and the second electrodes RME2 by an electric field formed in a particular direction between the first electrodes RME1 and the second electrodes RME2.

For example, the light-emitting elements ED may include active layers that include the same material, and may thus emit light of the same wavelength range or of the same color. Beams of light emitted from the first, second, and third emission areas LA1, LA2, and LA3 of the light-emitting element layer EML may have the same color. For example, the light-emitting elements ED may emit third-color light or blue light having a peak wavelength of about 440 nm to about 480 nm, but the disclosure is not limited thereto.

The second insulating film IL2 may be disposed on the light-emitting elements ED. For example, the second insulating film IL2 may surround parts of the light-emitting elements ED and may not cover both ends of each of the light-emitting elements ED. The second insulating film IL2 may protect the light-emitting elements ED and may fix the light-emitting elements ED during the fabrication of the display device 10. The second insulating film IL2 may fill the space between the light-emitting elements ED and the first insulating film IL1.

The first contact electrodes CTE1 may be disposed on the first insulating film IL1 and may be inserted in contact holes of the first insulating film IL1 to be electrically connected to the first electrodes RME1. For example, the contact holes of the first insulating film IL1 may be provided above the protruding patterns BP, but the disclosure is not limited thereto. First ends of the first contact electrodes CTE1 may be electrically connected to the first electrodes RME1, on the protruding patterns BP, and second ends of the first contact electrodes CTE1 may be electrically connected to the first ends of the light-emitting elements ED.

The second contact electrodes CTE2 may be disposed on the first insulating film IL1 and may be inserted in contact holes of the first insulating film IL1 to be electrically connected to the second electrodes RME2. For example, the contact holes of the first insulating film IL1 may be provided above the protruding patterns BP, but the disclosure is not limited thereto. First ends of the second contact electrodes CTE2 may be electrically connected to the second ends of the light-emitting elements ED, and second ends of the second contact electrodes CTE2 may be electrically connected to the second electrodes RME2, on the protruding patterns BP.

The third insulating film IL3 may be disposed on the first contact electrodes CTE1, the second contact electrodes CTE2, the sub-banks SB, the first insulating film ILL and the second insulating film IL2. The third insulating film IL3 may be disposed at the top of the light-emitting element layer EML to protect the light-emitting element layer EML.

The wavelength conversion layer WLCL may be disposed on the light-emitting element layer EML. The wavelength conversion layer WLCL may include first light-blocking members BK1, a first wavelength converter WLC1, a second wavelength converter WLC2, a light transmitter LTU, a second passivation layer PAS2, and a second planarization layer 0C2.

The first light-blocking members BK1 may be disposed in the light-blocking area BA, on the third insulating film IL3. The first light-blocking members BK1 may overlap the sub-banks SB in the thickness direction (or the Z-axis direction). The first light-blocking members BK1 may block the transmission of light. The first light-blocking members BK1 may improve the color reproducibility of the display device 10 by preventing beams of light emitted from the first, second, and third emission areas LA1, LA2, and LA3 from being mixed together. In a plan view, the first light-blocking members BK1 may be arranged in a lattice form to surround the first, second, and third emission areas LA1, LA2, and LA3.

The first wavelength converter WLC1 may be disposed in the first emission area LA1, on the third insulating film IL3. The first wavelength converter WLC1 may be surrounded by the first light-blocking members BK1. The first wavelength converter WLC1 may include a first base resin BS1, a first scatterer SCT1, and a first wavelength shifter WLS1.

The first base resin BS1 may include a material with relatively high light transmittance. The first base resin BS1 may be formed of a transparent organic material. For example, the first base resin BS1 may include at least one organic material of an epoxy resin, an acrylic resin, a cardo resin, and an imide resin.

The first scatterer SCT1 may have a different refractive index from the first base resin BS1 and may form an optical interface with the first base resin BS1. For example, the first scatterer SCT1 may include a light-scattering material or light-scattering particles capable of scattering at least some (or part) of light passing through the first wavelength converter WLC1. For example, the first scatterer SCT1 may include a metal oxide such as titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$) or organic particles formed of an acrylic resin or a urethane resin. The first scatterer SCT1 may scatter light in random directions, regardless of the incidence direction of incident light thereupon, without substantially changing the peak wavelength of the incident light.

The first wavelength shifter WLS1 may convert or shift the peak wavelength of incident light into a first peak wavelength. For example, the first wavelength shifter WLS1 may convert blue light provided by the display device 10 into red light having a single peak wavelength of about 610 nm to about 650 nm and may emit the red light. The first wavelength shifter WLS1 may include quantum dots, quantum rods, or a phosphor. The quantum dots may be a particulate material that emits light of a particular color in response to the transition of the electrons from a conduction band to a valence band.

Some of blue light provided by the light-emitting element layer EML may not be converted into red light by the first wavelength shifter WLS1, but may pass through the first wavelength converter WLC1. Blue light incident upon a first color filter CF1 without being converted into red light by the first wavelength shifter WLS1 may be blocked by the first color filter CF1. Red light obtained from blue light by the first wavelength converter WLC1 may pass through the first color filter CF1 and may then be emitted to the outside of the display device 10. Accordingly, the first emission area LA1 may emit red light.

The second wavelength converter WLC2 may be disposed in the second emission area LA2, on the third insulating film IL3. The second wavelength converter WLC2 may be surrounded by the first light-blocking members BK1. The second wavelength converter WLC2 may include a second base resin BS2, a second scatterer SCT2, and a second wavelength shifter WLS2.

The second base resin BS2 may include a material with relatively high light transmittance. The second base resin BS2 may be formed of a transparent organic material. For example, the second base resin BS2 and the first base resin BS1 may include the same material.

The second scatterer SCT2 may have a different refractive index from the second base resin BS2 and may form an optical interface with the second base resin BS2. For example, the second scatterer SCT2 may include a light-scattering material or light-scattering particles capable of scattering at least some of light passing through the second wavelength converter WLC2. For example, the second scatterer SCT2 and the first scatterer SCT1 may include the same material.

The second wavelength shifter WLS2 may convert or shift the peak wavelength of incident light into a second peak wavelength which is different from the first peak wavelength. For example, the second wavelength shifter WLS2 may convert blue light provided by the light-emitting element layer EML into green light having a single peak wavelength of about 510 nm to about 550 nm and may emit the green light. The second wavelength shifter WLS2 may include quantum dots, quantum rods, or a phosphor. The second wavelength shifter WLS2 and the first wavelength shifter WLS1 may include the same material. The second wavelength shifter WLS2 may be formed as quantum dots, quantum rods, or a phosphor having a different wavelength conversion range from the first wavelength shifter WLS1.

The light transmitter LTU may be disposed in the third emission area LA3 and on the third insulating film IL3. The light transmitter LTU may be surrounded by the first light-blocking members BK1. The light transmitter LTU may transmit incident light therethrough while maintaining the peak wavelength of the incident light. The light transmitter LTU may include a third base resin BS3 and a third scatterer SCT3.

The third base resin BS3 may include a material with relatively high light transmittance. The third base resin BS3 may be formed of a transparent organic material. For example, the third base resin BS3 and the first or second base resin BS1 or BS2 may include the same material.

The third scatterer SCT3 may have a different refractive index from the third base resin BS3 and may form an optical interface with the third base resin BS3. For example, the third scatterer SCT3 may include a light-scattering material or light-scattering particles capable of scattering at least some of light passing through the light transmitter LTU. For example, the third scatterer SCT3 and the first or second scatterer SCT1 or SCT2 may include the same material.

As the wavelength conversion layer WLCL is disposed on the third insulating film IL3 of the light-emitting element layer EML, the display device 10 may not need a separate substrate for the first wavelength converter WLC1, the second wavelength converter WLC2, and the light transmitter LTU. Thus, the first wavelength converter WLC1, the second wavelength converter WLC2, and the light transmitter LTU can be easily aligned in the first, second, and third emission areas LA1, LA2, and LA3, respectively, and the thickness of the display device 10 can be reduced.

The second passivation layer PAS2 may cover the first wavelength converter WLC1, the second wavelength converter WLC2, the light transmitter LTU, and the first light-blocking members BK1. For example, the second passivation layer PAS2 may seal the first wavelength converter WLC1, the second wavelength converter WLC2, and the light transmitter LTU and may thereby prevent the first wavelength converter WLC1, the second wavelength converter WLC2, and the light transmitter LTU from being damaged or polluted. For example, the second passivation layer PAS2 may include an inorganic material.

The second planarization layer OC2 may be disposed on the second passivation layer PAS2 to planarize the tops of the first wavelength converter WLC1, the second wavelength converter WLC2, and the light transmitter LTU. For example, the second planarization layer OC2 may include an organic insulating material such as PI.

The color filter layer CFL may be disposed on the wavelength conversion layer WLCL. The color filter layer CFL may include second light-blocking members BK2, the first color filter CF1, a second color filter CF2, a third color filter CF3, and a third passivation layer PAS3.

The second light-blocking members BK2 may be disposed in the light-blocking area BA, on the second planarization layer OC2 of the wavelength conversion layer WLCL. The second light-blocking members BK2 may overlap the first light-blocking members BK1 or the sub-banks SB in the thickness direction (or the Z-axis direction). The second light-blocking members BK2 may block the transmission of light. The second light-blocking members BK2 may improve the color reproducibility of the display device 10 by preventing beams of light emitted from the first, second, and third emission areas LA1, LA2, and LA3 from being mixed together. For example, in a plan view, the second light-blocking members BK2 may be arranged in a lattice form to surround the first, second, and third emission areas LA1, LA2, and LA3.

The first color filter CF1 may be disposed in the first emission area LA1 and on the second planarization layer OC2. The first color filter CF1 may be surrounded by the second light-blocking members BK2. The first color filter CF1 may overlap the first wavelength converter WLC1 in the thickness direction (or the Z-axis direction). The first color filter CF1 may selectively transmit first-color light (e.g., red light) therethrough and may block or absorb second-color light (e.g., green light) and third-color light (e.g., blue light). For example, the first color filter CF1 may be a red filter and may include a red colorant.

The second color filter CF2 may be disposed in the second emission area LA2 and on the second planarization layer OC2. The second color filter CF2 may be surrounded by the second light-blocking members BK2. The second color filter CF2 may overlap the second wavelength converter WLC2 in the thickness direction (or the Z-axis direction). The second color filter CF2 may selectively transmit second-color light (e.g., green light) therethrough and may block or absorb first-color light (e.g., red light) and third-color light (e.g., blue light). For example, the second color filter CF2 may be a green filter and may include a green colorant.

The third color filter CF3 may be disposed in the third emission area LA3 and on the second planarization layer OC2. The third color filter CF3 may be surrounded by the second light-blocking members BK2. The third color filter CF3 may overlap the light transmitter LTU in the thickness direction (or the Z-axis direction). The third color filter CF3 may selectively transmit third-color light (e.g., blue light) therethrough and may block or absorb first-color light (e.g., red light) and second-color light (e.g., green light). For example, the third color filter CF3 may be a blue filter and may include a blue colorant.

The first, second, and third color filters CF1, CF2, and CF3 may reduce the reflection of external light by absorbing some of the external light. Thus, the first, second, and third color filters CF1, CF2, and CF3 can prevent color distortions that may be caused by the reflection of external light.

As the first, second, and third color filters CF1, CF2, and CF3 are disposed directly on the second planarization layer OC2 of the wavelength conversion layer WLCL, the display device 10 may not need a separate substrate for the first, second, and third color filters CF1, CF2, and CF3. Thus, the thickness of the display device 10 can be reduced.

The third passivation layer PAS3 may cover (or overlap) the first, second, and third color filters CF1, CF2, and CF3. The third passivation layer PAS3 may protect the first, second, and third color filters CF1, CF2, and CF3.

The encapsulation layer TFE may be disposed on the third passivation layer PAS3 of the color filter layer CFL. The encapsulation layer TFE may cover (or overlap) the top surface and side surface of the display layer DPL. For example, the encapsulation layer TFE may include at least one inorganic film and may prevent the infiltration of oxygen or moisture. The encapsulation layer TFE may also include at least one organic film and may protect the display device from foreign materials such as dust.

The pad part PD may be disposed on a first surface or the top surface of the first substrate SUB1. The pad part PD may be disposed above the first contact hole CNT1, which is planarized. The bottom surface of the pad part PD may be flat. The pad part PD may not be inserted in the first contact hole CNT1. The pad part PD may be electrically connected to the first connecting line CWL1, which is inserted in the second contact hole CNT2. The pad part PD may be electrically connected to the flexible film FPCB by the connecting film ACF, which is inserted into the first contact hole CNT1. The pad part PD may provide an electrical signal received from the flexible film FPCB to the first connecting line CWL1.

Thus, as the pad part PD is disposed above the first contact hole CNT1, which is planarized by patterning the first substrate SUB1 from the top surface of the first substrate SUB1, damage that may be caused to the first substrate SUB1 when the first contact hole CNT1 is formed by patterning the first substrate SUB1 from the bottom surface of the first substrate SUB1 can be prevented. Also, the pad part PD can be prevented from being accidentally detached from the first substrate SUB1, as compared to a case where the pad part PD is inserted in the first contact hole CNT1. Accordingly, the level of difficulty of the manufacture of the display device 10 can be reduced, and as a result, the productivity and reliability of the manufacture of the display device 10 can be improved.

The connecting film ACF may be inserted in the first contact hole CNT1 of the first substrate SUB1. The top surface of the connecting film ACF may be coplanar with the top surface of the first substrate SUB1. The connecting film ACF may attach one end of the flexible film FPCB to the pad part PD. A first surface of the connecting film ACF may be attached to the pad part PD, at the top of the first contact hole CNT1, and a second surface of the connecting film ACF may be attached to the flexible film FPCB, at the bottom of the first contact hole CNT1. For example, the connecting film ACF may include an anisotropic conductive film. In case that the connecting film ACF includes an anisotropic conductive film, the connecting film ACF may have conductivity in a region where the pad part PD and a contact pad of the flexible film FPCB contact each other, and may electrically connect the flexible film FPCB and the pad part PD.

The flexible film FPCB may be disposed on the bottom surface of the first substrate SUB1. The flexible film FPCB may be attached to the bottom surface of the first substrate SUB1 by an adhesive member AD. The adhesive member AD may fix the flexible film FPCB and may prevent the penetration of moisture through the first contact hole CNT1. One side of the flexible film FPCB may be electrically connected to the pad part PD by the connecting film ACF, and another side of the flexible film FPCB may be electrically connected to a source circuit board (not illustrated). The flexible film FPCB may transmit signals from the data driver DIC to the display device 10. For example, the data driver DIC may be an integrated circuit (IC). The data driver DIC may convert digital video data into analog data voltages based on data control signals and may provide the analog data voltages to the data lines of the display area DA through the flexible film FPCB. As the display device 10 includes the pad part PD, which is disposed on the top surface of the first substrate SUB1, and the flexible film FPCB, which is disposed on the bottom surface of the first substrate SUB1, the size of the non-display area NDA can be reduced or minimized.

FIGS. 6 to 12 are schematic cross-sectional views illustrating a method of manufacturing a display device according to an embodiment.

Figure 6:
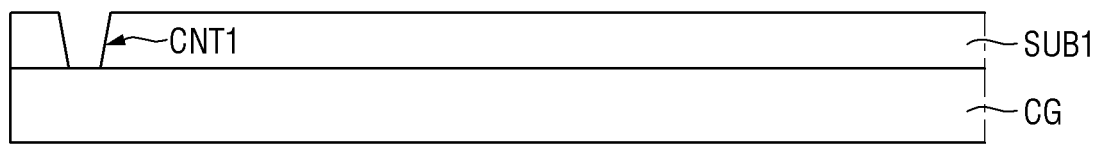
FIGS. 6 to 12 are schematic cross-sectional views illustrating a method of manufacturing a display device according to an embodiment of the disclosure.

Referring to FIG. 6, a carrier substrate CG may support a display device 10 during the fabrication of the display device 10. For example, the carrier substrate CG may be carrier glass, but the disclosure is not limited thereto.

A first substrate SUB1 may be disposed on the carrier substrate CG. The first substrate SUB1 may be a base substrate or a base member. The first substrate SUB1 may be a flexible substrate that is bendable, foldable, or rollable. For example, the first substrate SUB1 may include an insulating material such as a polymer resin, for example, PI, but the disclosure is not limited thereto.

The first contact hole CNT1 may be formed in a part of the first substrate SUB1. The first contact hole CNT1 may be formed by patterning the first substrate SUB1 from the top surface of the first substrate SUB1 and may penetrate through the first substrate SUB1 to the bottom surface of the first substrate SUB1. Thus, the upper width of the first contact hole CNT1 may be greater than the lower width of the first contact hole CNT1. For example, the first contact hole CNT1 may be patterned by a photolithography process, but the disclosure is not limited thereto. As the first substrate SUB1 is patterned while being supported by the carrier substrate CG, the first substrate SUB1 may not be damaged. As another example, the first contact hole CNT1 may be patterned by a laser process or a plasma process.

Figure 7:
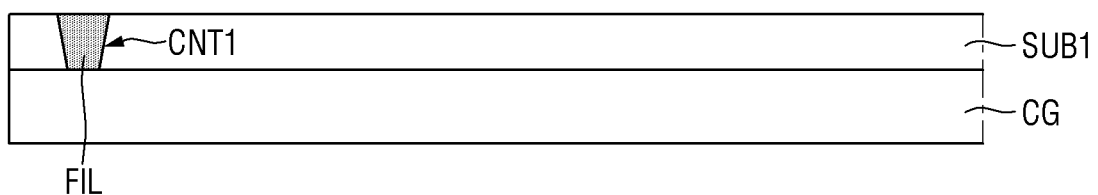

Referring to FIG. 7, a filler part FIL may planarize the top of the first substrate SUB1 by filling the first contact hole CNT1 in the first substrate SUB1. The top surface of the filler part FIL may be coplanar with the top surface of the first substrate SUB1. The filler part FIL may planarize a region in which a pad part PD is arranged, by filling the first contact hole CNT1.

For example, the filler part FIL may include an organic material. The filler part FIL may include at least one of an acrylic resin, an epoxy resin, a phenolic resin, a polyamide resin, and a polyimide resin.

As another example, the filler part FIL may include photoresist. The filler part FIL may include positive photoresist or negative photoresist.

Figure 8:
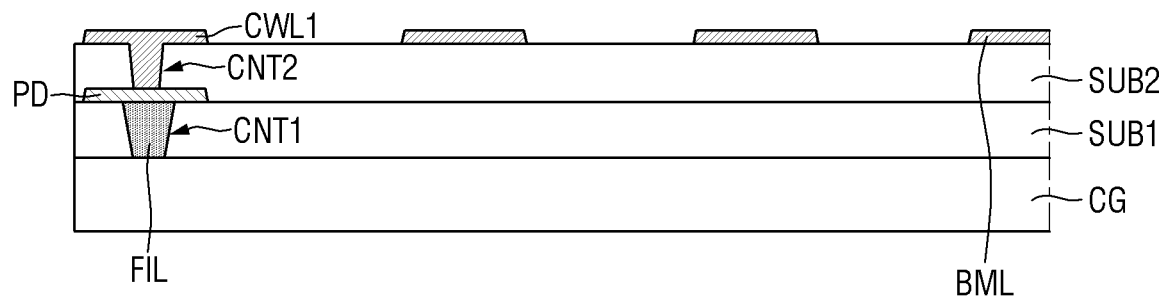

Referring to FIG. 8, the pad part PD may be disposed on a first surface or the top surface of the first substrate SUB1. The pad part PD may be disposed above the first contact hole CNT1, which is planarized. The pad part PD may not be inserted in the first contact hole CNT1. In case that the first contact hole CNT1 is not filled with the filler part FIL and the pad part PD is inserted in the first contact hole CNT1, the pad part PD may be detached during the detachment of the carrier substrate CG. However, as the pad part PD is disposed above the first contact hole CNT1, which is planarized, the pad part PD can be prevented from being accidentally detached from the first substrate SUB1.

A second substrate SUB2 may be disposed on the pad part PD and the first substrate SUB1. For example, the second substrate SUB2 may include an insulating material such as a polymer resin, for example, PI, but the disclosure is not limited thereto. The second substrate SUB2 may include a second contact hole CNT2. The second contact hole CNT2 may be formed by patterning the second substrate SUB2 from the top surface of the second substrate SUB2 and may penetrate through the second substrate SUB2 to the bottom surface of the second substrate SUB2.

A first connecting line CWL1 and a light-blocking layer BML, may be disposed on the second substrate SUB2 to be spaced apart from each other. The first connecting line CWL1 and the light-blocking layer BML may be formed in the same layer and of the same material. The first connecting line CWL1 may be inserted into the second contact hole CNT2 to be electrically connected to the pad part PD.

Figure 9:
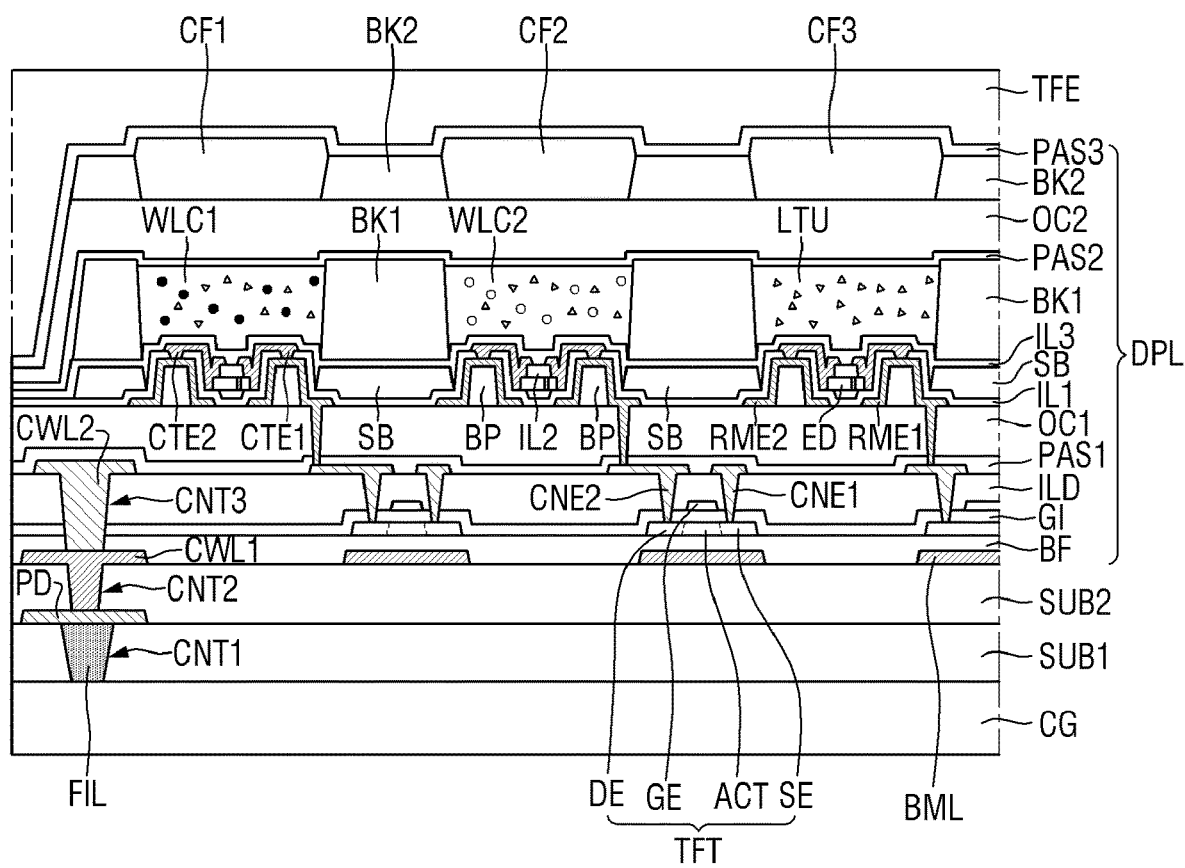

Referring to FIG. 9, a display layer DPL may be deposited on the second substrate SUB2. A thin-film transistor layer TFTL, a light-emitting element layer EML, a wavelength conversion layer WLCL, and a color filter layer CFL may be sequentially deposited on the second substrate SUB2. An encapsulation layer TFE may cover (or overlap) the top surface and side surface of the display layer DPL.

Figure 10:
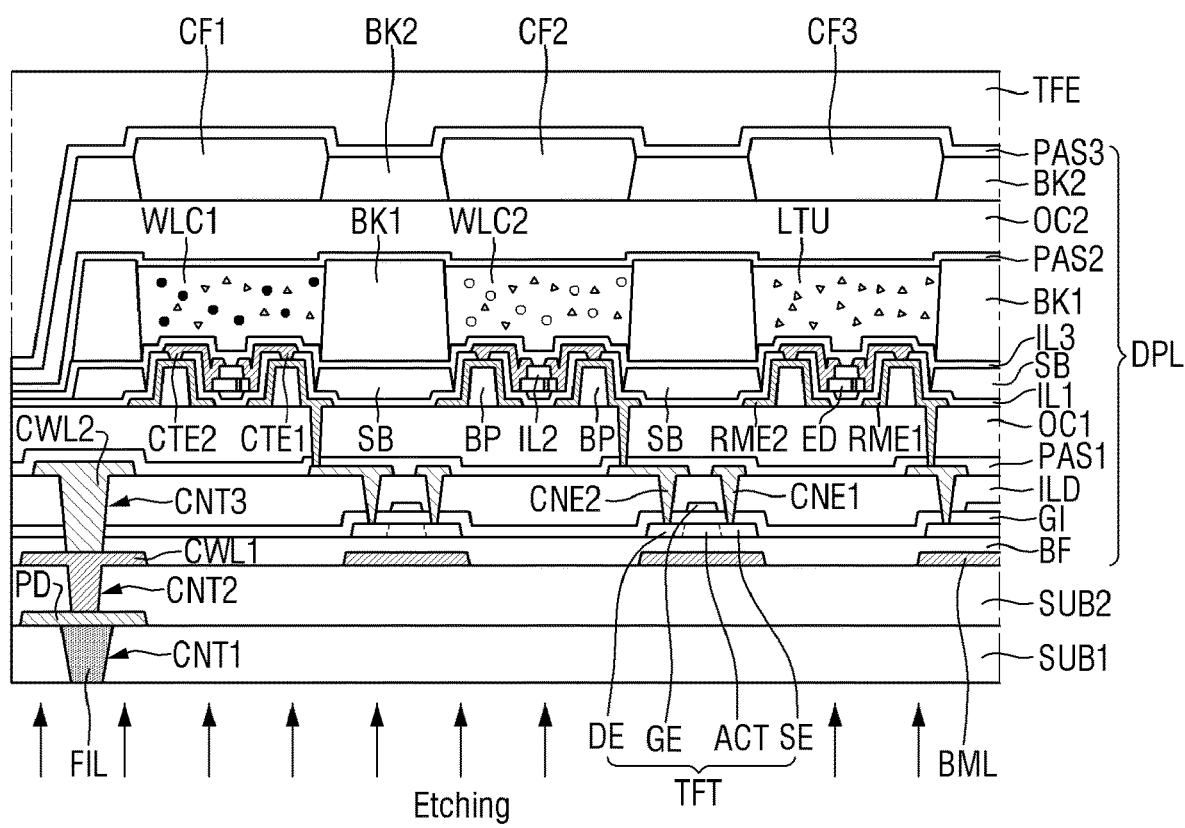

Referring to FIG. 10, the carrier substrate CG may be removed from the bottom of the first substrate SUB1. For example, the carrier substrate CG may be removed from the bottom surface of the first substrate SUB1 by using a sacrificial layer (not illustrated) disposed between the carrier substrate CG and the first substrate SUB1, but the disclosure is not limited thereto.

Figure 11:
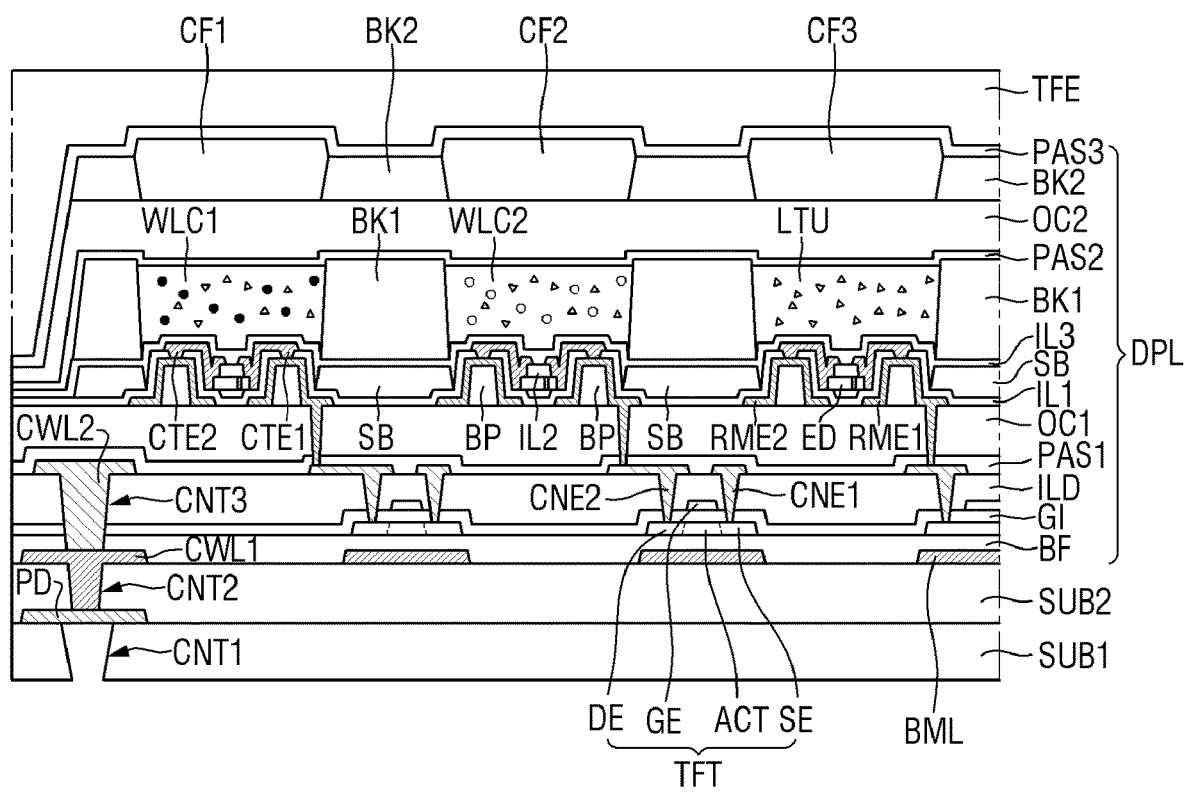

Referring to FIG. 11, the filler part FIL, which is inserted into the first contact hole CNT1, may be removed by an etching process. At least one of a dry etching process, a plasma etching process, and a laser etching process may be performed on the bottom surface of the first substrate SUB1, and the filler part FIL may be selectively removed. An etching process having a predetermined etch selectivity may be performed on the entire bottom surface of the first substrate SUB1. Here, the predetermined etch selectivity may be set such that the etch rate of the filler part FIL may be much faster than the etch rate of the first substrate SUB1.

The predetermined etch selectivity may be controlled such that the filler part FIL may be selectively etched without etching the bottom surface of the first substrate SUB1. For example, the predetermined etch selectivity may be determined by process conditions such as gas, temperature, pressure, and plasma power. Thus, the first substrate SUB1 may not be damaged, and the filler part FIL can be quickly removed. As the filler part FIL is etched away, the bottom surface of the pad part PD may be exposed by the first contact hole CNT1.

If the first contact hole CNT1 is formed by etching the bottom surface of the first substrate SUB1 after the removal of the carrier substrate CG, the first substrate SUB1 may be damaged, or patterning may take an excessive amount of time. Thus, as the first contact hole CNT1 is formed by patterning the first substrate SUB1 from the top surface of the first substrate SUB1 and the filler part FIL is removed with the etch selectivity of the filler part FIL with respect to the first substrate SUB, after the deposition of the display layer DPL with the use of the filler part FIL, damage to the first substrate SUB1 can be prevented, and the patterning can be quickly performed.

Figure 12:
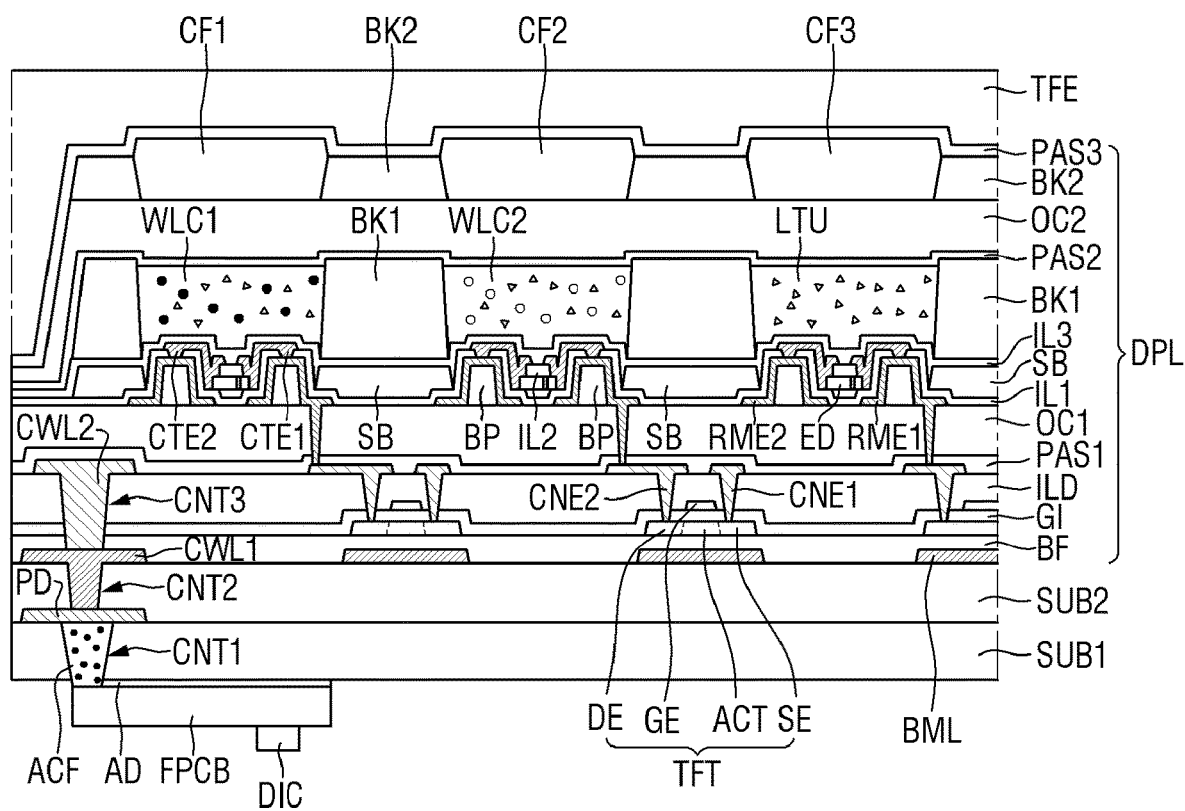

Referring to FIG. 12, a connecting film ACF may be inserted into the first contact hole CNT1 of the first substrate SUB1. The connecting film ACF may attach an end of a flexible film FPCB to the pad part PD. A first surface of the connecting film ACF may be attached to the pad part PD, above the first contact hole CNT1, and a second surface of the connecting film ACF may be attached to the flexible film FPCB, below the first contact hole CNT1.

The flexible film FPCB may be disposed on the bottom surface of the first substrate SUB1. A first side of the flexible film FPCB may be electrically connected to the pad part PD, and a second side of the flexible film FPCB may be electrically connected to a source circuit board (not illustrated), at the bottom surface of the first substrate SUB1. The flexible film FPCB may transmit signals of a data driver DIC to the display device 10.

Figure 13:
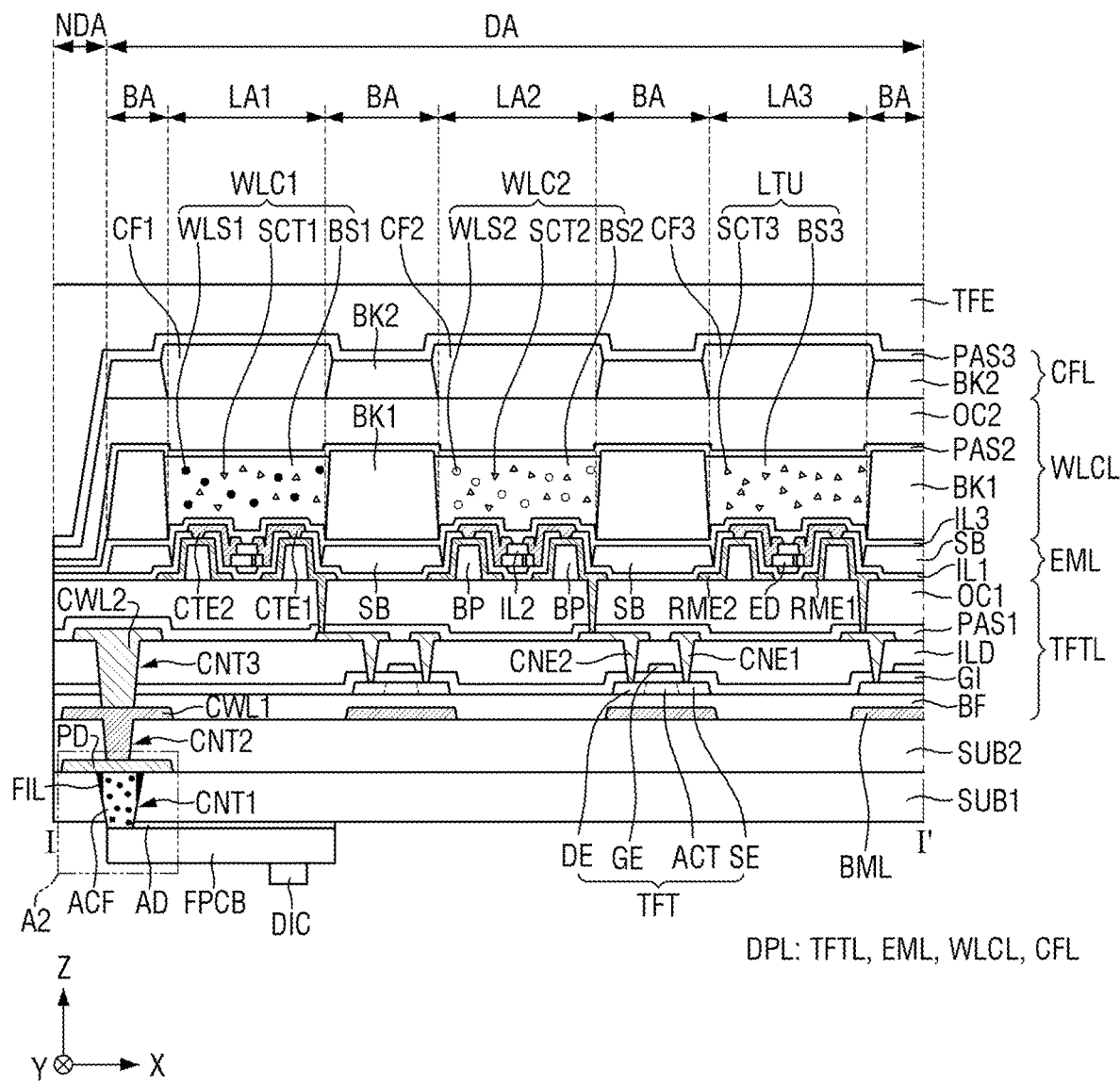
FIG. 13 is a schematic cross-sectional view, taken along line I-I' of FIG. 2, of a display device according to another embodiment of the disclosure.
Figure 14:
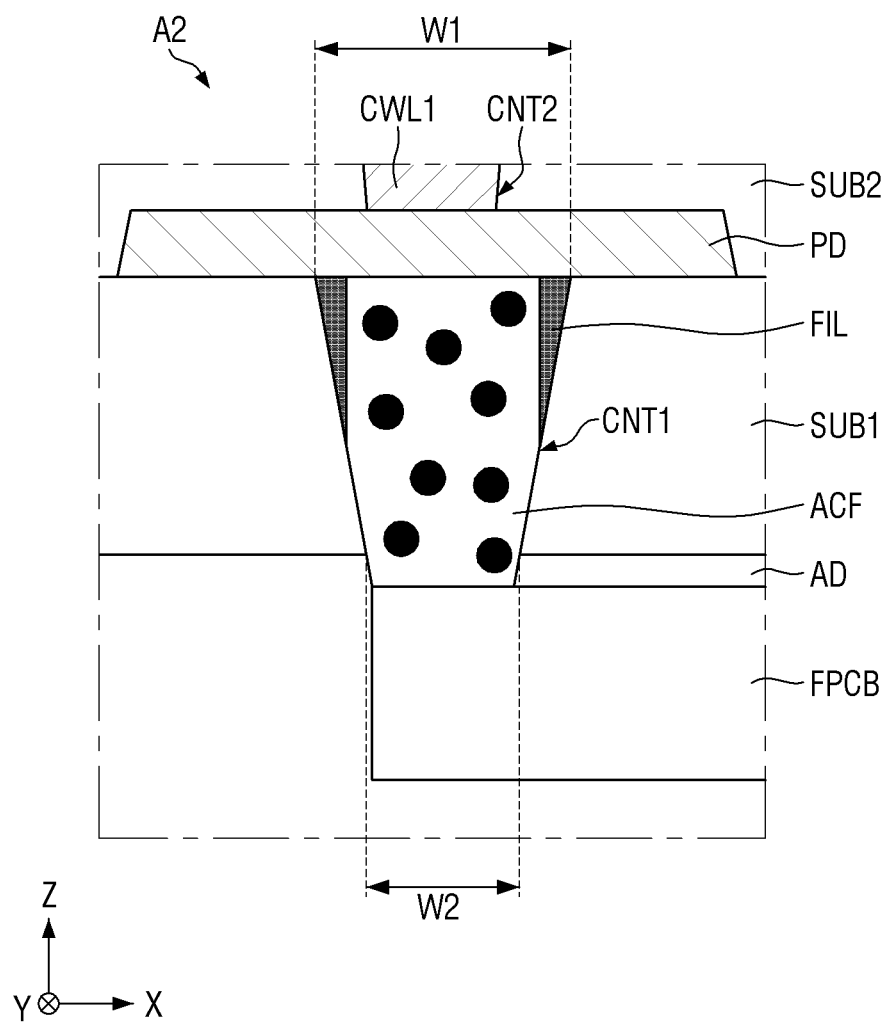
FIG. 14 is a schematic enlarged cross-sectional view of an area A2 of FIG. 13.

FIG. 13 is a schematic cross-sectional view, taken along line I-I' of FIG. 2, of a display device according to an embodiment, and FIG. 14 is a schematic enlarged cross-sectional view of area A2 of FIG. 13. The display device of FIGS. 13 and 14 differs from the display device of FIGS. 1 to 12 in a filler part FIL remaining in a first contact hole CNT1, and thus, descriptions of elements or features that have already been described above will be omitted or simplified.

Referring to FIGS. 13 and 14, a first substrate SUB1 may support a display device 10. The first substrate SUB1 may be a base substrate or a base member. For example, the first substrate SUB1 may include an insulating material such as a polymer resin, for example, PI, but the disclosure is not limited thereto.

The first substrate SUB1 may include a first contact hole CNT1. The first contact hole CNT1 may be formed by patterning the first substrate SUB1 from the top surface of the first substrate SUB1 and may penetrate through the first substrate SUB1 to the bottom surface of the first substrate SUB1. For example, an upper width W1 of the first contact hole CNT1 may be greater than a lower width W2 of the first contact hole CNT1.

The filler part FIL may be disposed at an upper periphery of the first contact hole CNT1. The filler part FIL may fill in the first contact hole CNT1 during the stacking of a display layer DPL and may thus planarize the top of the first substrate SUB1. The filler part FIL may be removed before the placement of a flexible film FPCB below the first substrate SUB1. An etching process having a predetermined etch selectivity may be performed on the entire bottom surface of the first substrate SUB1. Here, the predetermined etch selectivity may be set such that the etch rate of the filler part FIL may be much faster than the etch rate of the first substrate SUB1. The predetermined etch selectivity may be controlled such that the filler part FIL may be selectively etched away without etching the bottom surface of the first substrate SUB1. For example, in case that an etching process having straightness is performed, a lower width W2 of the first contact hole CNT1 is smaller than an upper width W1 of the first contact hole CNT1, and as a result, the filler part FIL may remain along the upper periphery of the first contact hole CNT1. The amount of the filler part FIL that remains may gradually increase toward the top of the first contact thole CNT1. The filler part FIL may surround an upper part of a connecting film ACF, which is inserted in the first contact thole CNT1, and may support part of a pad part PD.

For example, the filler part FIL may include an organic material. The filler part FIL may include at least one of an acrylic resin, an epoxy resin, a phenolic resin, a polyamide resin, and a polyimide resin.

As another example, the filler part FIL may include photoresist. The filler part FIL may include positive photoresist or negative photoresist.

The pad part PD may be disposed on a first surface or the top surface of the first substrate SUB1. The pad part PD may be disposed above the first contact hole CNT1, which is planarized by the filler part FIL. The pad part PD may not be inserted in the first contact hole CNT1. The pad part PD may be electrically connected to a first connecting line CWL1, which is inserted in a second contact hole CNT2. The pad part PD may be electrically connected to the flexible film FPCB through the connecting film ACF, which is inserted in the first contact hole CNT1. The pad part PD may provide an electrical signal received from the flexible film FPCB to the first connecting line CWL1.

Thus, as the pad part PD is disposed above the first contact hole CNT1, which is planarized by patterning the first substrate SUB1 from the top surface of the first substrate SUB1, damage that may be caused to the first substrate SUB1, as compared to a case where the first contact hole CNT1 is formed by patterning the first substrate SUB1 from the bottom surface of the first substrate SUB1 can be prevented. Also, the pad part PD can be prevented from being accidentally detached from the first substrate SUB1 in case that the pad part PD is inserted in the first contact hole CNT1.

The connecting film ACF may be inserted in the first contact hole CNT1 of the first substrate SUB1. The connecting film ACF may attach one end of the flexible film FPCB to the pad part PD. The upper part of the connecting film ACF may be surrounded by the filler part FIL. A first surface of the connecting film ACF may be attached to the pad part PD, at the top of the first contact hole CNT1, and a second surface of the connecting film ACF may be attached to the flexible film FPCB, at the bottom of the first contact hole CNT1. For example, the connecting film ACF may include an anisotropic conductive film. In case that the connecting film ACF includes an anisotropic conductive film, the connecting film ACF may have conductivity in a region where the pad part PD and a contact pad of the flexible film FPCB contact each other, and may electrically connect the flexible film FPCB and the pad part PD.

Figure 15:
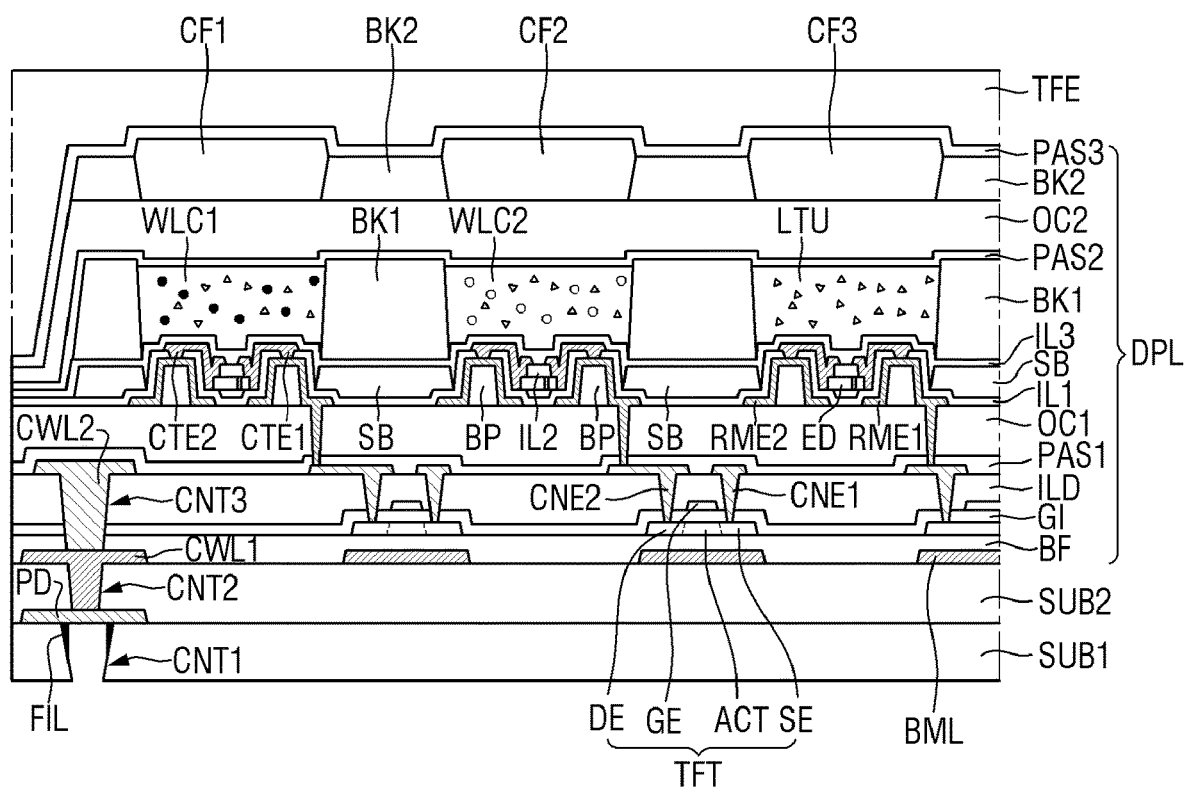
FIGS. 15 and 16 are schematic cross-sectional views illustrating a method of manufacturing a display device according to another embodiment of the disclosure.
Figure 16:
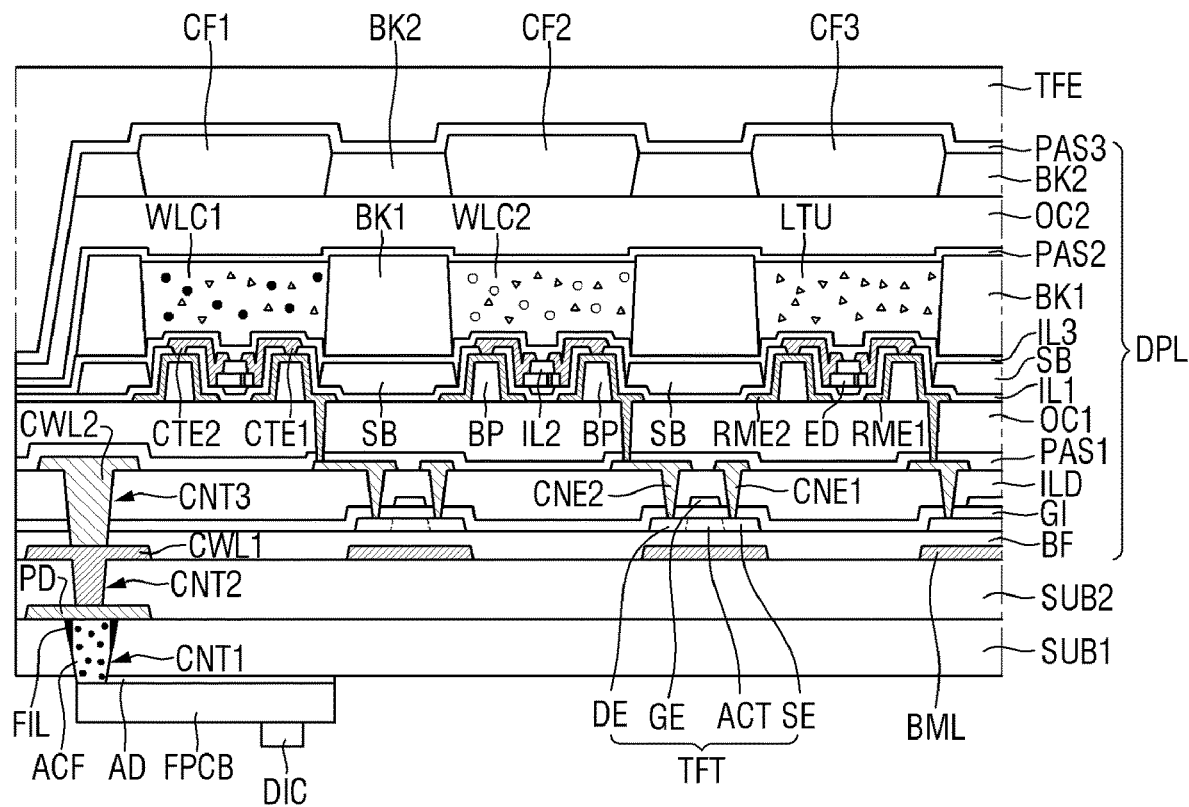

FIGS. 15 and 16 are schematic cross-sectional views illustrating a method of manufacturing a display device according to an embodiment. FIG. 15 illustrates a process following the process illustrated in FIG. 10.

Referring to FIG. 15, a part of a filler part FIL may be removed by an etching process, and another part of the filler part FIL may remain along an upper periphery of a first contact hole CNT1. At least one of a dry etching process, a plasma etching process, and a laser etching process may be performed on the bottom surface of a first substrate SUB1, and the filler part FIL may be selectively removed. An etching process having a predetermined etch selectivity may be performed on the entire bottom surface of the first substrate SUB1. Here, the predetermined etch selectivity may be set such that the etch rate of the filler part FIL may be much faster than the etch rate of the first substrate SUB1. The predetermined etch selectivity may be controlled such that the filler part FIL may be selectively etched away without etching the bottom surface of the first substrate SUB1. The predetermined etch selectivity may be determined by process conditions such as gas, temperature, pressure, and plasma power. For example, in case that an etching process having straightness is performed, the lower width of the first contact hole CNT1 is smaller than the upper width of the first contact hole CNT1, and as a result, the filler part FIL may remain along the upper periphery of the first contact hole CNT1. The amount of the filler part FIL that remains may gradually increase closer to the top of the first contact thole CNT1. The filler part FIL may surround an upper part of a connecting film ACF, which is inserted in the first contact thole CNT1, and may support a part of a pad part PD. Thus, the first substrate SUB1 may not be damaged, and the filler part FIL can be quickly removed. As the filler part FIL is etched away, the bottom surface of the pad part PD may be exposed by the first contact hole CNT1.

If the first contact hole CNT1 is formed by etching the bottom surface of the first substrate SUB1 after the removal of a carrier substrate CG, the first substrate SUB1 may be damaged, or patterning may take an excessive amount of time. Thus, as the first contact hole CNT1 is formed by patterning the first substrate SUB1 from the top surface of the first substrate SUB1 and the filler part FIL is removed with the etch selectivity of the filler part FIL with respect to the first substrate SUB, after the deposition of the display layer DPL with the use of the filler part FIL, damage to the first substrate SUB1 can be prevented, and patterning can be quickly performed.

Referring to FIG. 16, the connecting film ACF may be inserted into the first contact hole CNT1 of the first substrate SUB1. The connecting film ACF may attach one end of a flexible film FPCB to the pad part PD. An upper part of the connecting film ACF may be surrounded by the filler part FIL. A first surface of the connecting film ACF may be attached to the pad part PD, at the top of the first contact hole CNT1, and a second surface of the connecting film ACF may be attached to the flexible film FPCB, at the bottom of the first contact hole CNT1.

The flexible film FPCB may be disposed on the bottom surface of the first substrate SUB1. One side of the flexible film FPCB may be electrically connected to the pad part PD, and the other side of the flexible film FPCB may be electrically connected to a source circuit board (not illustrated), at the bottom surface of the first substrate SUB1. The flexible film FPCB may transmit signals of a data driver DIC to a display device 10.

Figure 17:
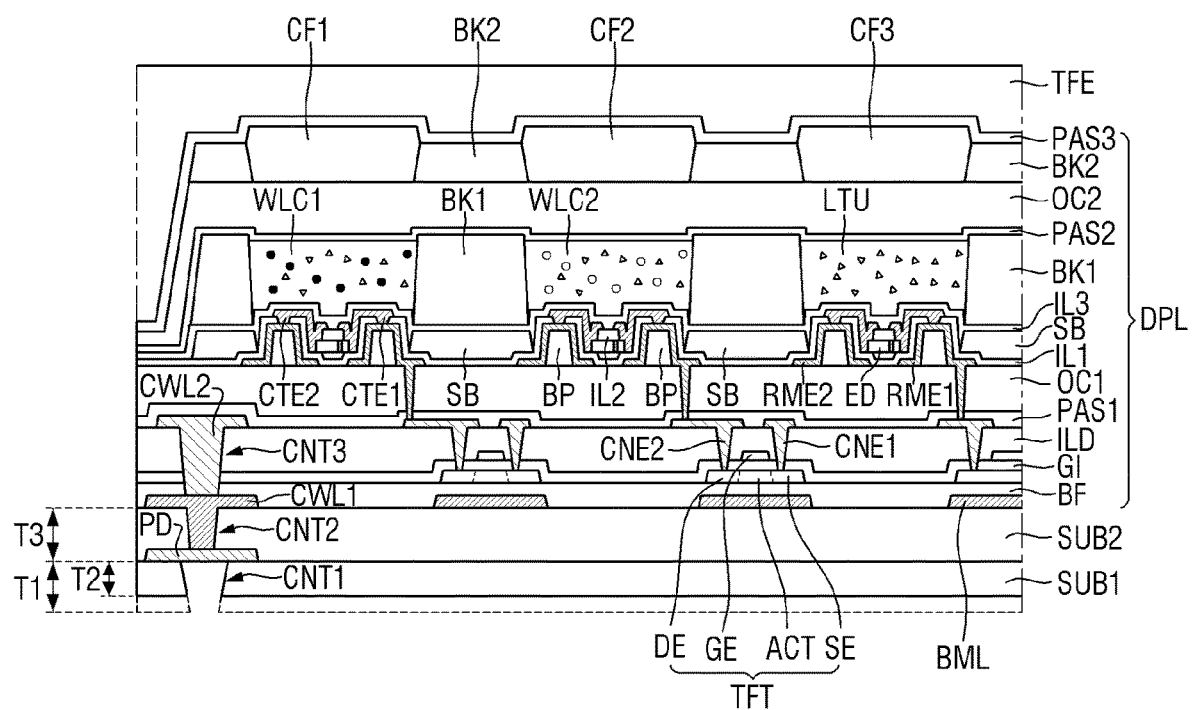
FIGS. 17 and 18 are schematic cross-sectional views illustrating a method of manufacturing a display device according to another embodiment of the disclosure.
Figure 18:
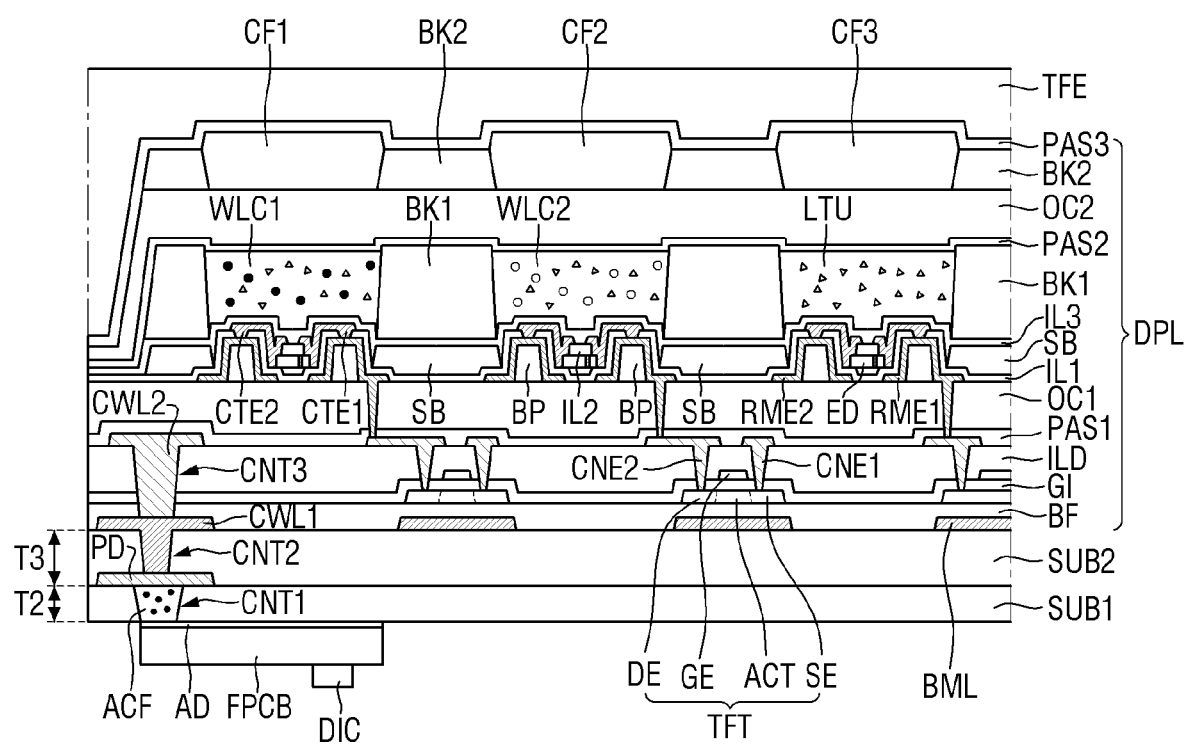

FIGS. 17 and 18 are schematic cross-sectional views illustrating a method of manufacturing a display device according to an embodiment. FIG. 17 illustrates a process following the process illustrated in FIG. 10.

Referring to FIG. 17, during the deposition of a display layer DPL, a first substrate SUB1 may have a first thickness T1, and a second substrate SUB2 may have a third thickness T3. A part of the bottom surface of the first substrate SUB1 and a filler part FIL inserted in a first contact hole CNT1 may be removed by an etching process. At least one of a dry etching process, a plasma etching process, and a laser etching process may be performed on the bottom surface of the first substrate SUB1, and part of the bottom surface of the first substrate SUB1 and the filler part FIL may be selectively removed. An etching process having a predetermined etch selectivity may be performed on the entire bottom surface of the first substrate SUB1. Here, the predetermined etch selectivity may be set such that the etch rate of the filler part FIL may be much faster than the etch rate of the first substrate SUB1. The predetermined etch selectivity may be controlled such that the part of the bottom surface of the first substrate SUB1 and the entire filler part FIL may be etched away. For example, the predetermined etch selectivity may be determined by process conditions such as gas, temperature, pressure, and plasma power. As a result of the etching process performed on the bottom surface of the first substrate SUB1, the first substrate SUB1 may have a second thickness T2, and the entire filler part FIL may be removed. The second thickness T2 of the first substrate SUB1 may be the same as or smaller than the third thickness T3 of the second substrate SUB2, but the disclosure is not limited thereto. As the filler part FIL is etched, the bottom surface of the pad part PD may be exposed by the first contact hole CNT1.

If the first contact hole CNT1 is formed by etching the bottom surface of the first substrate SUB1 after the removal of a carrier substrate CG, the first substrate SUB1 may be damaged, or patterning may take an excessive amount of time. Thus, as the first contact hole CNT1 is formed by patterning the first substrate SUB1 from the top surface of the first substrate SUB1 and the filler part FIL is removed with the etch selectivity of the filler part FIL with respect to the first substrate SUB, after the deposition of the display layer DPL with the use of the filler part FIL, damage to the first substrate SUB1 can be prevented, and patterning can be quickly performed.

Referring to FIG. 18, the connecting film ACF may be inserted in the first contact hole CNT1 of the first substrate SUB1. The connecting film ACF may attach one end of a flexible film FPCB to the pad part PD. A first surface of the connecting film ACF may be attached to the pad part PD, at the top of the first contact hole CNT1, and a second surface of the connecting film ACF may be attached to the flexible film FPCB, at the bottom of the first contact hole CNT1.

Figure 19:
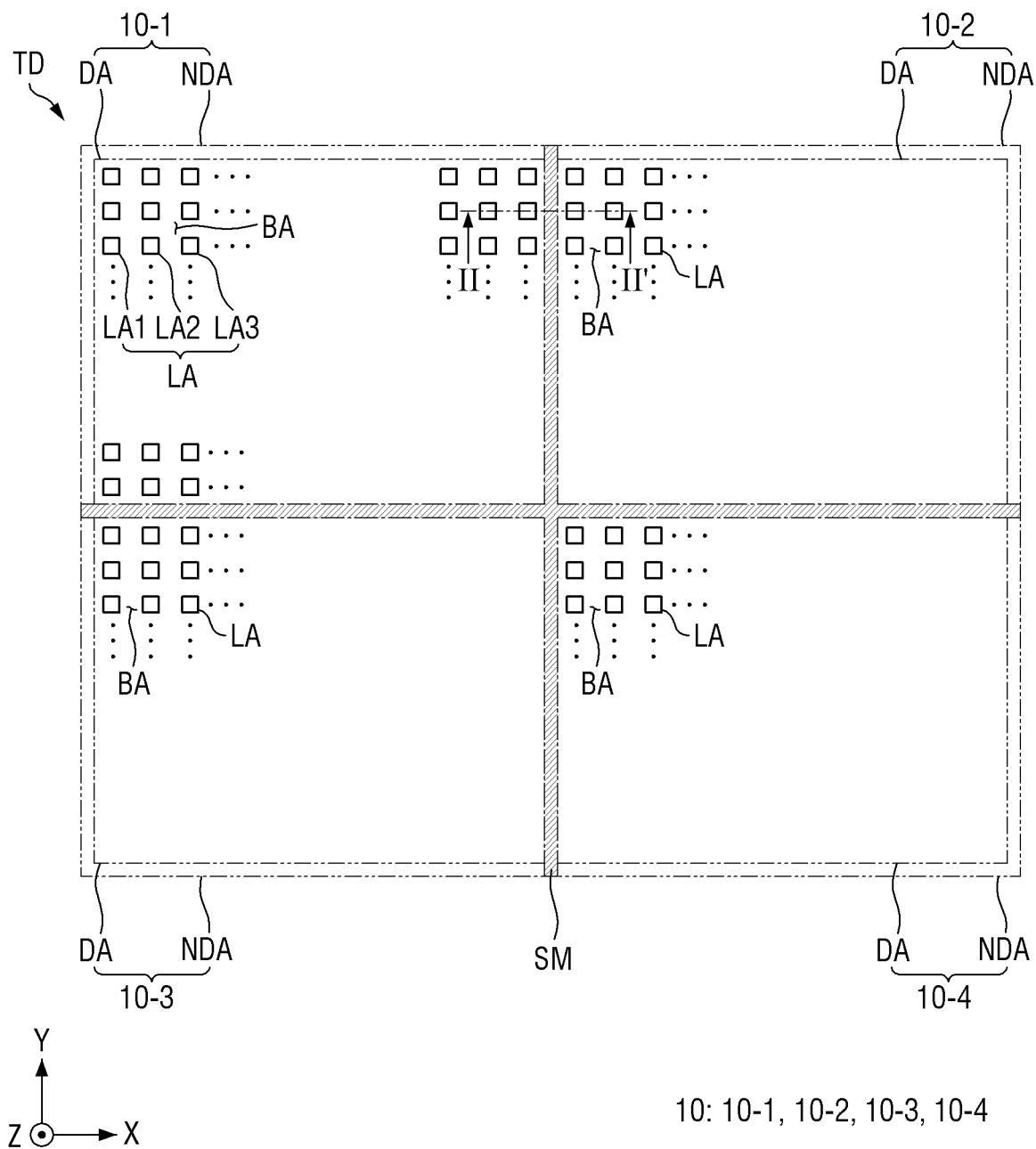
FIG. 19 is a schematic plan view illustrating how the elements of a tiled display device according to an embodiment of the disclosure are combined.
Figure 20:
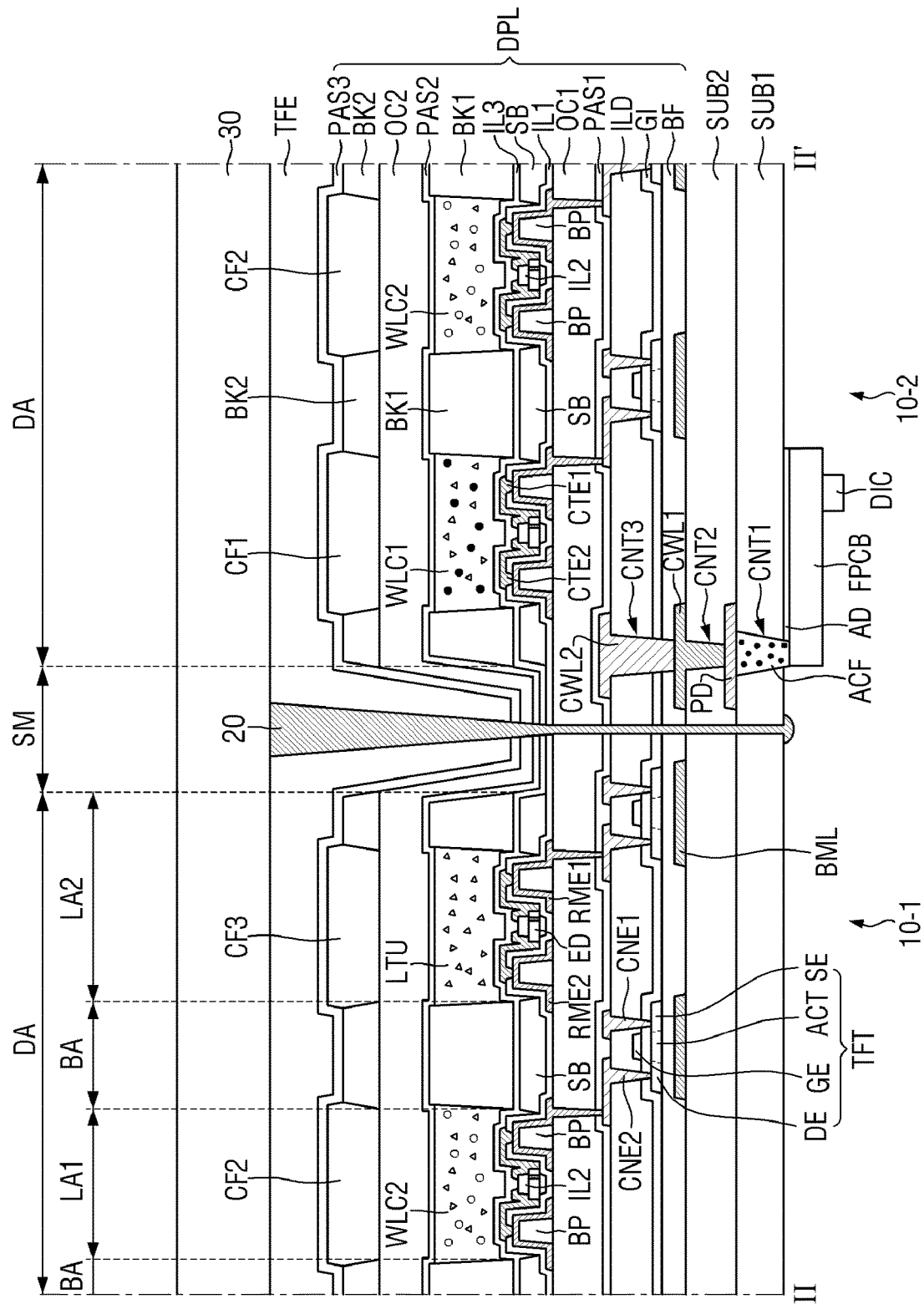
FIG. 20 is a schematic cross-sectional view taken along line II-II' of FIG. 19.

FIG. 19 is a schematic plan view illustrating how the elements of a tiled display device according to an embodiment are combined, and FIG. 20 is a schematic cross-sectional view taken along line II-II' of FIG. 19.

Referring to FIGS. 19 and 20, a tiled display device TD may include display devices 10, a bonding member 20, and a cover member 30. The display devices 10 may be arranged in a lattice pattern, but the disclosure is not limited thereto. The display devices 10 may be connected to one another in a first direction (or an X-axis direction) or a second direction (or a Y-axis direction), and the tiled display device TD may have a particular shape. For example, the display devices 10 may have the same size, but the disclosure is not limited thereto. As another example, the display devices 10 may have different sizes.

The tiled display device TD may include first to fourth display devices 10-1 to 10-4. The number of display devices 10 included in the tiled display device TD and how the display devices 10 are coupled or connected to one another are not particularly limited. The number of display devices 10 included in the tiled display device TD may be determined by the size of the display devices 10 and the size of the tiled display device TD.

Each of the display devices 10 may include a display area DA and a non-display area NDA. The display area DA may include pixels and may display an image. The non-display area NDA may be disposed around the display area DA to surround the display area DA and may not display an image.

The tiled display device TD may include a bonding area SM, which is disposed between display areas DA. The tiled display device TD may be obtained by connecting the non-display areas NDA of the display devices 10. The display devices 10 may be connected to one another via a bonding member or an adhesive member disposed in the bonding area SM. The bonding area SM may not include pad parts or flexible films attached to pad parts. Thus, the distance between the display areas DA of the display devices 10 may be so close that the bonding area SM may become substantially invisible to the user. The display areas DA of the display devices 10 and the bonding area SM may have substantially the same reflectance. Thus, the tiled display device TD can overcome the sense of discontinuity between the display devices 10 and improve the degree of immersion in an image by preventing the bonding area SM from being visually recognized by the user.

Each of the display devices 10 may include pixels, which are arranged in multiple rows and multiple columns, in a display area DA. Each of the pixels may include an emission area LA, which is defined by a pixel-defining film or a bank, and may emit light having a predetermined peak wavelength through the emission area LA. For example, the display area DA of each of the display devices 10 may include first emission areas LA1, second emission areas LA2, and third emission areas LA3. The first emission areas LA1, the second emission areas LA2, and the third emission areas LA3 may be areas that emit light generated by light-emitting elements of each of the display device 10 to the outside of each of the display devices 10.

The first emission areas LA1, the second emission areas LA2, and the third emission areas LA3 may be sequentially and repeatedly arranged in the first direction (or the X-axis direction) in each of the display areas DA. For example, the first emission areas LA1 may be larger in size than the second emission areas LA2, and the second emission areas LA2 may be larger in size than the third emission area LA3. As another example, the first emission areas LA1, the second emission areas LA2, and the third emission areas LA3 may have substantially the same size.

The display device DA of each of the display devices 10 may further include a light-blocking area BA, which surrounds the first emission areas LA1, the second emission areas LA2, and the third emission areas LA3. The light-blocking area BA may prevent beams of light emitted from the first emission areas LA1, the second emission areas LA2, and the third emission areas LA3 from being mixed together.

The tiled display device TD may allow the side surfaces of the first and second display devices 10-1 and 10-2 to be bonded to each other using a bonding member 20, which is disposed between the first and second display devices 10-1 and 10-2. The bonding member 20 may connect the side surfaces of each of the first, second, third, and fourth display devices 10-1, 10-2, 10-3, and 10-4, which are arranged in a lattice pattern, and may thus realize the tiled display device TD. The bonding member 20 may couple or connect the side surfaces of each of first and second substrates SUB1 and SUB2, a display layer DPL, and an encapsulation layer TFE of each of every two adjacent display devices 10 together.

For example, the bonding member 20 may be formed as a relatively thin adhesive or double-sided tape and may thus minimize the distance between the first and second display devices 10-1 and 10-2. As another example, the bonding member 20 may be formed as a relatively thin bonding frame and may thus minimize the distance between the first and second display devices 10-1 and 10-2. Thus, the tiled display device TD can prevent the bonding area SM between the first and second display devices 10-1 and 10-2 from being visually recognized by the user.

The cover member 30 may be disposed on the top surfaces of the first and second display devices 10-1 and 10-2 and the top surface of the bonding member 20 to cover the first and second display devices 10-1 and 10-2 and the bonding member 20. For example, the cover member 30 may be disposed on the top surfaces of the encapsulation layers TFE of the first and second display devices 10-1 and 10-2. The cover member 30 may protect the top surface of the tiled display device TD.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
   a first substrate including a first contact hole;
   a pad part disposed on the first substrate, the pad part overlapping the first contact hole;
   a second substrate disposed on the pad part and the first substrate;
   a display layer disposed on the second substrate;
   a flexible film disposed on a bottom surface of the first substrate;
   a connecting film inserted in the first contact hole, the connecting film electrically connecting the pad part and the flexible film;
   a filler part being at an upper periphery of the first contact hole and surrounding an upper part of the connecting film and supporting a part of the pad part; and
   a data driver disposed on a lower surface of the flexible film, the lower surface being opposite to an upper surface of the flexible film facing the bottom surface of the first substrate, wherein
   an upper width of the first contact hole is greater than a lower width of the first contact hole.

2. The display device of claim 1, wherein a top surface of the connecting film and a top surface of the first substrate are disposed on a same plane.

3. The display device of claim 1, wherein a bottom surface of the pad part is flat.

4. The display device of claim 1, wherein the filler part includes at least one of an acrylic resin, an epoxy resin, a phenolic resin, a polyamide resin, and a polyimide resin.

5. The display device of claim 1, wherein the filler part includes a positive photoresist or a negative photoresist.

6. The display device of claim 1, further comprising an adhesive member attaching the flexible film to the bottom surface of the first substrate, wherein
   the connecting film includes an anisotropic conductive film, and
   the adhesive member is directly between the data driver and the first substrate along a line perpendicular to the bottom surface of the first substrate.

7. The display device of claim 1, further comprising:
   a first connecting line disposed on the second substrate, the first connecting line being electrically connected to the pad part through a second contact hole formed in the second substrate, the second contact hole being directly above the first contact hole.

8. The display device of claim 1, wherein the display layer comprises:
   a thin-film transistor layer disposed on the second substrate and including thin-film transistors;
   a light-emitting element layer disposed on the thin-film transistor layer and including light-emitting elements; and
   a wavelength conversion layer disposed on the light-emitting element layer and converting the wavelength of light emitted by the light-emitting elements.

9. The display device of claim 8, wherein the thin-film transistor layer comprises:
   a buffer layer disposed on a first connecting line and the second substrate;
   a gate insulating film disposed on the buffer layer;
   an interlayer insulating film disposed on the gate insulating film;
   connecting electrodes disposed on the interlayer insulating film and electrically connected to the thin-film transistors; and
   a second connecting line disposed on the interlayer insulating film and electrically connected to the first connecting line through a third contact hole penetrating the interlayer insulating film, the gate insulating film, and the buffer layer.

10. A tiled display device comprising:
    display devices each including:
    a display area including pixels; and
    a non-display area adjacent to the display area; and
       a bonding member connecting the display devices to one another, wherein each of the display devices comprises:
    a first substrate including a first contact hole;
    a pad part disposed on the first substrate and entirely covering the first contact hole;
    a second substrate disposed on and above the pad part and the first substrate;
    a display layer disposed on and above the second substrate;
    a flexible film disposed on a bottom surface of the first substrate;
    a connecting film inserted in the first contact hole and electrically connecting the pad part and the flexible film; and
    a filler part being at an upper periphery of the first contact hole and surrounding an upper part of the connecting film and supporting a part of the pad part, wherein
       an upper width of the first contact hole is greater than a lower width of the first contact hole.

* * * * *